(12) United States Patent
Miyazaki

(10) Patent No.: US 8,694,871 B2
(45) Date of Patent: Apr. 8, 2014

(54) ITERATIVE DECODING METHOD FOR ENCODED SIGNAL AND ITERATIVE DECODING APPARATUS FOR ENCODED SIGNAL

(75) Inventor: Shunji Miyazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/555,737

(22) Filed: Jul. 23, 2012

(65) Prior Publication Data

US 2013/0086443 A1    Apr. 4, 2013

(30) Foreign Application Priority Data

Sep. 30, 2011    (JP) .................................. 2011-218378

(51) Int. Cl.
*H03M 13/05*    (2006.01)
*H03M 13/53*    (2006.01)

(52) U.S. Cl.
USPC ............................ 714/776; 714/755; 714/780

(58) Field of Classification Search
None
See application file for complete search history.

(56) References Cited

U.S. PATENT DOCUMENTS

| | | | |
|---|---|---|---|
| 6,477,678 B1 * | 11/2002 | Fang et al. | 714/755 |
| 2008/0130769 A1 * | 6/2008 | Papadopoulos et al. | 375/260 |
| 2009/0077457 A1 * | 3/2009 | Ramesh et al. | 714/807 |
| 2009/0132893 A1 * | 5/2009 | Miyazaki et al. | 714/776 |
| 2012/0054585 A1 * | 3/2012 | Jiang et al. | 714/777 |

FOREIGN PATENT DOCUMENTS

WO    WO-2008/015742    2/2008

OTHER PUBLICATIONS $3^{rd}$ Generation Partnership Project; GPP TS 36.212 V8.8.0 (Dec. 2009), pp. 1-60.

* cited by examiner

*Primary Examiner* — Ajay Bhatia
*Assistant Examiner* — Dipakkumar Gandhi
(74) *Attorney, Agent, or Firm* — Fujitsu Patent Center

(57) ABSTRACT

A iterative decoding method for iteratively carrying out a decoding process for an encoded segmented and signal transmitted in a plurality of ($N_{cb}$) sub blocks for each predetermined block unit includes storing a number of ($n_{cb}$) sub blocks smaller than the number ($N_{cb}$) of the sub blocks; and successively and iteratively carrying out a decoding process for each of the stored ($n_{cb}$) sub blocks within a specified time period determined based on the number ($n_{cb}$).

20 Claims, 20 Drawing Sheets

ITERATIVE DECODING METHOD FOR ENCODED SIGNAL AND ITERATIVE DECODING APPARATUS FOR ENCODED SIGNAL

CROSS-REFERENCE TO RELATED APPLICATION

This application is based upon and claims the benefit of priority of the prior Japanese Patent Application No. 2011-218378, filed on Sep. 30, 2011, the entire contents of which are incorporated herein by reference.

FIELD

The present invention relates to a iterative decoding method for an encoded signal and a iterative decoding apparatus for an encoded signal.

BACKGROUND

In a wireless communication system, when information is to be transmitted to a receiver apparatus through a radio channel, a transmission apparatus carries out an encoding process for information bits to be transmitted.

In the wide sense, the encoding process signifies an error correction encoding process for compensating for bit errors of information bits occurring in the transmission apparatus, receiver apparatus, radio channel and so forth or such processes as rate matching (RM) and channel interleave (ChIL) carried out for encoded bits obtained as a result of the error correction encoding and so forth.

Here, the processes carried out for the encoded bits are referred to as communication path encoding process in order to distinguish the process from the error correction encoding process. In other words, the encoding process is configured from the error correction encoding process and the communication path encoding process.

On the other hand, the receiver apparatus carries out a decoding process for received data.

The decoding process is carried out for cancelling the effect of the encoding process carried out by the transmission apparatus and estimates information bits transmitted from the transmission apparatus from the received data.

Therefore, the decoding process is configured from a communication path decoding process and an error correction decoding process, and the processes respectively correspond to the communication path encoding process and the error correction encoding process in the transmission apparatus (it is to be noted that, unless confusion occurs, the processes are hereinafter referred to simply as communication path process and decoding process).

The communication path process is carried out for cancelling the effect of the communication path encoding process carried out by the transmission apparatus, and signifies such processes as channel deinterleave (ChDeIL) and derate matching (DeRM) carried out for individual encoded blocks for which the communication path encoding process has been carried out and so forth.

The decoding process is carried out for cancelling the effect of the error correction encoding process carried out by the transmission apparatus and estimates information bits actually transmitted thereto from received data for which the communication path process has been carried out.

The encoding process and the decoding process are described in more detail below.

(1) Processing Unit, Transmission Rate

The present case presupposes a communication system wherein a block encoding process is carried out. In this instance, encoding and decoding of information bits to be transmitted are carried out in a certain processing unit time period. It is to be noted that the processing unit and the unit of transmission bits are hereinafter referred to as sub frame and transport block (TRB), respectively, in accordance with the 3GPP (3rd Generation Partnership Project) system which is an example of a communication system for carrying out a block encoding process.

The transmission rate per TRB in the layer 1-level is generally determined by a time interval between processing units and a bit size of a TRB.

(2) Communication Path Encoding Process

As described above, the communication path encoding process includes, for example, channel interleave and rate matching.

(2-A) Channel Interleave

The channel interleave is a treatment for dispersing places at which an error appears in received data to the entire codes by carrying out permutation of encoded bits in order to prevent such a situation that the SNR (Signal to Noise Ratio) of a radio channel is degraded in burst by fading or the like and errors appear successively at a specific place of the received data.

(2-B) Rate Matching

The rate matching is carried out for performing such treatments as puncturing and repetition for encoded bits when there is a difference between the encoded bit size and bits which can be actually transmitted.

The puncturing is a treatment for thinning out bits at specified positions on the transmission side. On the other hand, on the reception side, 0 is inserted into each position from which a bit was thinned out.

Meanwhile, the repetition is a treatment for copying and repeating bits on the transmission side. On the other hand, on the reception side, each copied bit is added (for example, Maximum Ratio Combination) to the bit of the copying source.

It is to be noted that, generally since a combination of bits to be treated has an influence on an error rate characteristic, a bit pattern by the thinning out or the repeating described above is determined depending upon the entire codes. Therefore, time required for the decoding process on the reception side depends on the code bit size.

A particular example of the channel interleave and the rate matching described above is disclosed, for example, in 3GPP TS36.212 v8.9.0.

(3) Code Block Segmentation

If the processing unit time period is fixed, then in order to increase the transmission rate, the size of the TRB may be increased. However, if the TRB is increased in size, then it comes to exceed a processing unit which can be processed in the encoding process and the decoding process.

Therefore, where the TRB size exceeds a certain specified size, the TRB is segmented into suitable sub blocks, and the encoding process and the decoding process are carried out in a unit of a sub block.

This sub block is called code block (CB), and to segment the TRB into a plurality of CBs is called code block segmentation.

It is to be noted that it is known generally that increase in size of the processing unit of a code is advantageous from a point of view of an error rate characteristic.

However, as regards a code whose encoding depends upon the bit size like a turbo code, if the processing unit increases, then the degree of complication in processing increases, which gives rise to difficulty upon incorporation of the code. Further, characteristic improvement reaches a saturation state at some degree of magnitude.

Therefore, it is effective to limit a processing unit for encoding to a suitable maximum value.

(4) Iterative Decoding

The iterative decoding is a decoding processing method represented by a turbo decoder and signifies, for example, a processing method wherein a predetermined element decoding process is carried out for received data (prior likelihood) and feeding back a posterior likelihood obtained as a result of the process to update the prior likelihood and then iteratively carrying out the element decoding process again for the updated prior likelihood to improve the accuracy of the posterior likelihood.

Further, bits obtained by displaying the posterior likelihood as a logarithm likelihood ratio and carrying out hard decision are used as estimation bits for the transmitted information bits.

Accordingly, the error rate of data after the iterative decoding is characterized taking inputted data (prior likelihood as data after the communication path decoding process) and a iteration number of times as parameters.

(4-A) Early Stopping Decision

Procedure capable of deciding whether or not estimation bits are bits (error free) same as the transmitted information bits (at least with a high degree of probability) is introduced. A process regarding the decision is referred to as error free decision process.

As a particular example of the error free decision process, a CRC (Cyclic Redundancy Check) applied for each CB in the LTE (Long Term Evolution) system of the 3GPP is available.

The error free decision process is carried out for each iterative process, and, if a decision of an error free condition is obtained, then the processing is stopped. Consequently, time required for the decoding process can be reduced.

(4-B) Iterative Controlling Method

As the decoding processing method in the iterative decoding apparatus, a method is known in which a plurality of CBs included in a TRB are successively processed using a single decoder (refer to Patent Document 1 specified hereinbelow).

FIG. 1 is a view illustrating an example of a conventional iterative controlling method in a iterative decoding apparatus.

The iterative decoding apparatus carries out a iterative decoding process in order for CBs for which the communication path process is carried out, and carries out an error free decision for each iteration of the iterative decoding process. Then, if it is decided that a result of the decision of an error free condition is obtained, then the iterative decoding process for a next CB is carried out immediately.

[Patent Document 1] International Publication Pamphlet No. WO 2008/015742

[Non-Patent Document 1] 3GPP TS36.212 v8.8.0

With the iterative controlling method illustrated in FIG. 1, there is the possibility that a iterative decoding process for each CB may be executed at almost all timings within a specified time period within which a iterative process by a decoder is carried out.

For example, if each CB is decided as error free with a small number of iterations, then the timing at which the iterative decoding process is to be carried out for each CB is advanced.

On the other hand, if the decoding process for the top CB (CB 1) is carried out without decided as error free till a point of time near to an end of the specified time period and thereafter the remaining CBs are processed in the remaining time period, then the timing at which the iterative decoding process is carried out for the remaining CBs is delayed.

Accordingly, it is required for the conventional iterative controlling apparatus to incorporate therein a memory capable of retaining input data of all CBs therein for a period from a timing at which the process for the top CB is started to an end of the specified time period.

Further, since, if the transmission rate increases, then the number of CBs increases accordingly, the required memory amount increases, resulting in difficulty in corporation of the iterative decoding apparatus described above.

SUMMARY

According to an aspect of the embodiments, a iterative decoding method for an encoded signal for iteratively carrying out a decoding process for an encoded signal segmented and transmitted in a plurality of ($N_{cb}$) sub blocks for each predetermined block unit, the iterative decoding method includes storing a number of ($n_{cb}$) sub blocks smaller than the number ($N_{cb}$) of the sub blocks, and successively and iteratively carrying out a decoding process for each of the stored ($n_{cb}$) sub blocks within a specified time period determined based on the number ($n_{cb}$).

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF THE PREFERRED EMBODIMENTS

In the following, embodiments of the present invention are described with reference to the drawings. It is to be noted, however, that the embodiments described below are illustrative to the end, and there is no intention to eliminate various modifications and applications of the technique not specified in the embodiments and modifications hereinafter described. In particular, it is a matter of course that the embodiments and modifications can be carried out in various modified forms without departing from the scope of the present invention.

[1] First Embodiment

Figure 1:
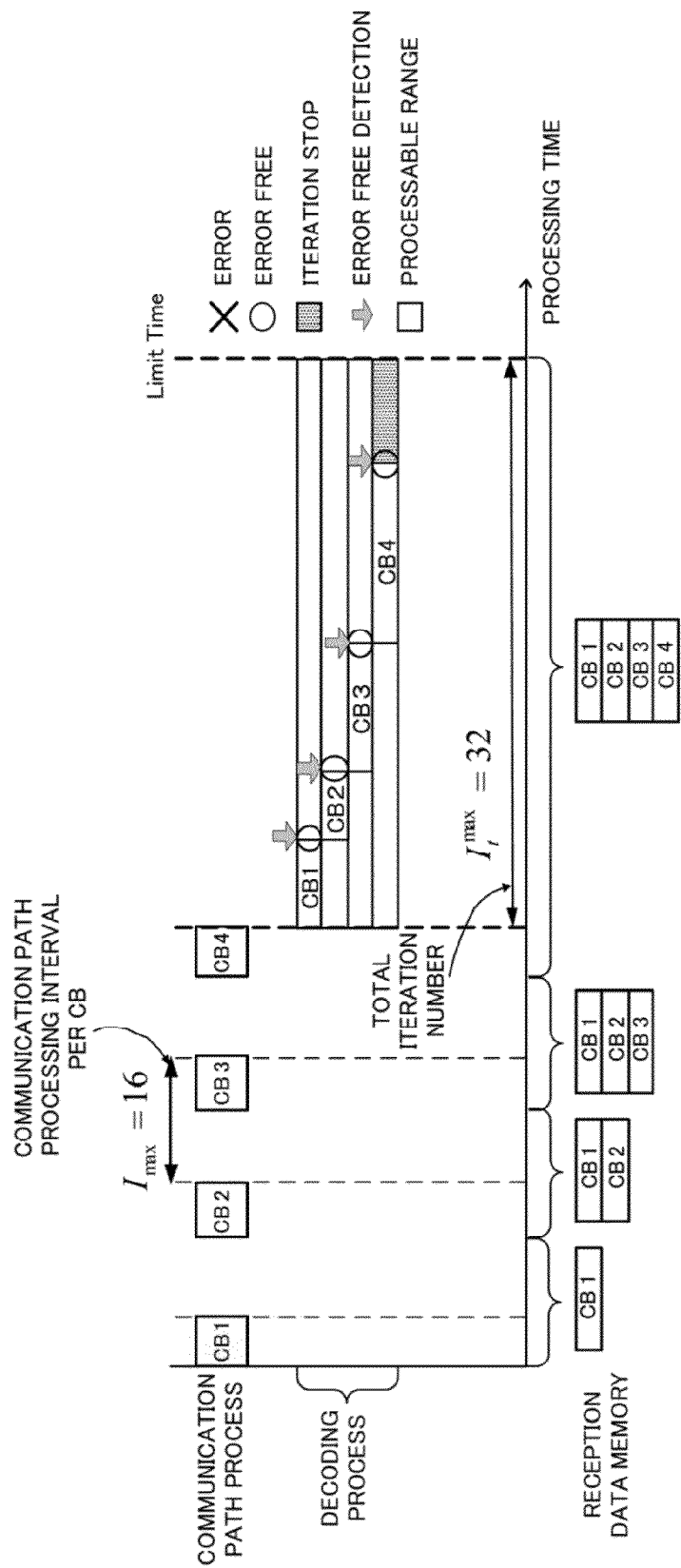
FIG. 1 is a view illustrating an example of a conventional iterative controlling method for a iterative decoding apparatus.
Figure 2:
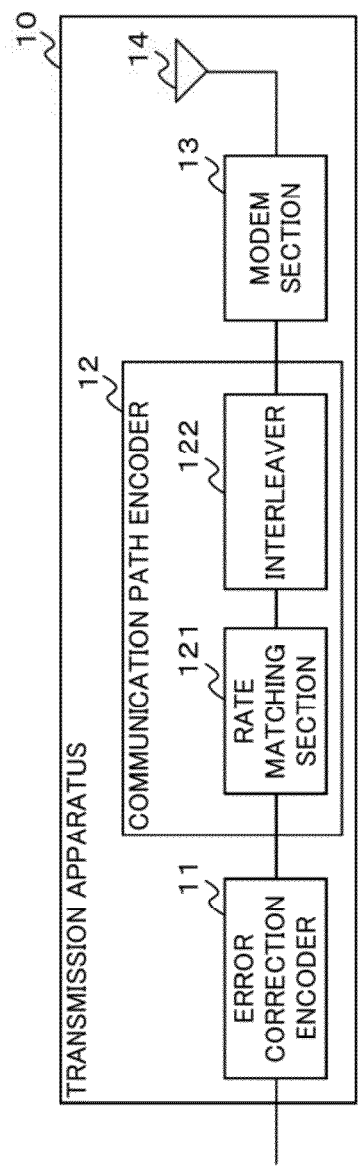
FIG. 2 is a block diagram illustrating an example of a configuration of a transmission apparatus according to a first embodiment.

FIG. 2 is a view illustrating an example of a configuration of a transmission apparatus according to a first embodiment.

The transmission apparatus 10 illustrated in FIG. 2 illustratively includes an error correction encoder 11, a communication path encoder 12, a modem section 13 and a transmission antenna 14.

The error correction encoder 11 carries out a predetermined encoding process for information bits to be transmitted. It is to be noted that, in the receiver apparatus according to the present embodiment, a iterative decoding process is carried out as hereinafter described. Therefore, the predetermined encoding process includes, as an example of encoding process using a code to which a iterative decoding process is carried out at the receiver apparatus, processes such as a turbo encoding process, an LDPC (Low-Density Parity-Check) encoding process and so forth. Further, such information bits as described above are segmented into code blocks (CBs), which are sub blocks, in a unit of a transport block (TRB), and the encoding process is carried out in a unit of a code block.

Encoded bits outputted from the error correction encoder 11 are outputted to the communication path encoder 12.

The communication path encoder 12 carries out a predetermined communication path encoding process for the encoded bits outputted from the error correction encoder 11.

The predetermined communication path encoding process includes such processes as rate matching, interleave and so forth.

Therefore, the communication path encoder 12 illustratively includes a rate matching section 121 and an interleaver 122.

The rate matching section 121 carries out such processes as puncturing for thinning out bits at specified positions, repetition for copying and repeating bits and so forth for the encoded bit.

The interleaver 122 carries out permutation of the bits outputted from the rate matching section 121.

The modem section 13 carries out a modulation process in accordance with a predetermined modulation method for the bits outputted from the communication path encoder. Further, the modem section 13 carries out a predetermined wireless transmission process such as frequency conversion (up convert), amplification and so forth for the modulated signal to covert the signal into a wireless signal, and then transmits the converted signal to a receiver apparatus through the transmission antenna 14.

With the configuration described above, in the transmission apparatus 10, the information bits are segmented into CBs in a unit of a TRB and the error correction encoding process by the error correction encoder 11, communication path encoding process by the communication path encoder 12 and modulation process by the modem section 13 are carried out for the resulting bits, and then resulting bits are transmitted to the receiver apparatus through the transmission antenna 14.

Figure 3:
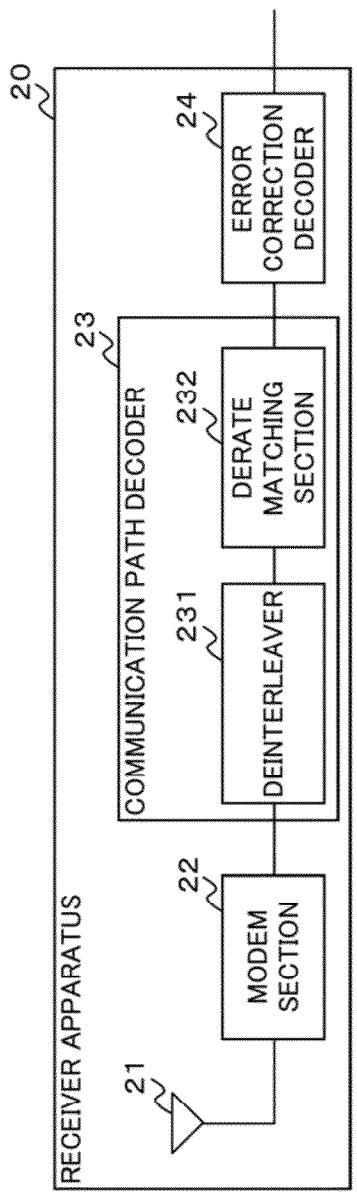
FIG. 3 is a block diagram illustrating an example of a configuration of a receiver apparatus according to the first embodiment.

FIG. 3 is a block diagram illustrating an example of a configuration of the receiver apparatus according to the first embodiment.

The receiver apparatus 20 illustrated in FIG. 3 illustratively includes a receiver antenna 21, a modem section 22, a communication path decoder 23 and an error correction decoder 24.

The modem section 22 carries out a predetermined wireless reception process such as an amplification process, a frequency conversion process (down convert) and so forth for the wireless signal received through the receiver antenna 21, and carries out a demodulation process corresponding to the modulation process on the transmission side for the resulting signal.

The signal outputted from the modem section 22 is outputted to the communication path decoder 23.

The communication path decoder 23 carries out a decoding process corresponding to the communication path encoding process by the communication path encoder 12.

Therefore, the communication path decoder 23 illustratively includes a deinterleaver 231 and a derate matching section 232.

The deinterleaver 231 carries out a process reverse to the bit permutation carried out by the interleaver 122.

The derate matching section 232 inserts, where puncturing is carried out by the rate matching section 121, 0 into the positions of the thinned out bits, but adds (for example, Maximum Ratio Combining), where repetition is carried out, copied bits to likelihood data of the bits of the copy source.

The error correction decoder 24 carries out a decoding process corresponding to the encoding process by the error correction encoder 12. In particular, the error correction decoder 24 carries out a iterative decoding process for the reception data outputted from the communication path decoder 23.

Figure 4:
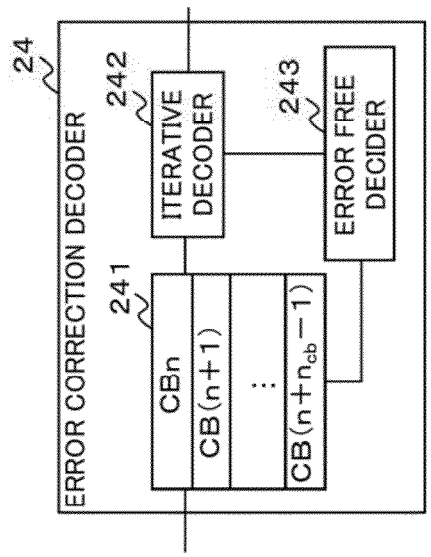
FIG. 4 is a block diagram illustrating an example of a configuration of an error correction decoder illustrated in FIG. 3.

FIG. 4 is a block diagram illustrating an example of a configuration of the error correction decoder 24 illustrated in FIG. 3.

The error correction decoder 24 illustrated in FIG. 4 includes a reception data memory 241, a iterative decoder 242 and an error free decider 243.

The reception data outputted from the communication path decoder 23 are successively stored into the reception data memory 241.

The iterative decoder 242 extracts the reception data from the reception data memory 241 and carries out the iterative decoding process successively for the extracted reception data.

The error free decider 243 carries out an error decision based on a CRC and so forth every time the iterative process by the iterative decoder 242 is carried out.

Here, if a result of the decision of an error free condition is obtained, then the iterative decoder 242 ends the iterative process and outputs decoded information bits.

On the other hand, if a result of the decision of an error free condition is not obtained, then the iterative decoder 242 successively carries out the decoding process iteratively until the number of times of iteration reaches a predetermined number of times so that accuracy of the decoding is enhanced.

In the following, a decoding method of the error correction decoder 24 is described in detail.

As illustrated in FIGS. 3 and 4, the error correction decoder 24 carries out the decoding process using the single iterative decoder 242 for the reception data outputted from the communication path decoder 23.

Further, while a TRB is segmented into and transmitted as a plurality of CBs as described hereinabove, the segmenting number is referred to as $N_{cb}$ ($N_{cb}$ is an integer equal to or greater than 1) here. The error correction decoder 24 carries out the decoding process in a unit of a CB.

While the present invention can be applied, for example, to transmission and reception of a downlink data channel PDSCH in the LTE (Long Term Evolution) system of 3GPP, the number of CBs corresponding to a maximum transmission rate in the PDSCH is 13.

Therefore, in the present embodiment, it is assumed that $N_{cb}$=13 such that the error correction decoder 24 receives a TRB configured from 13 CBs and carries out the communication path process and the decoding process in the order as received. It is to be noted that a CB received by the nth (n indicates an arbitrary integer equal to or greater than 1) is referred to as CBn.

Figure 5:
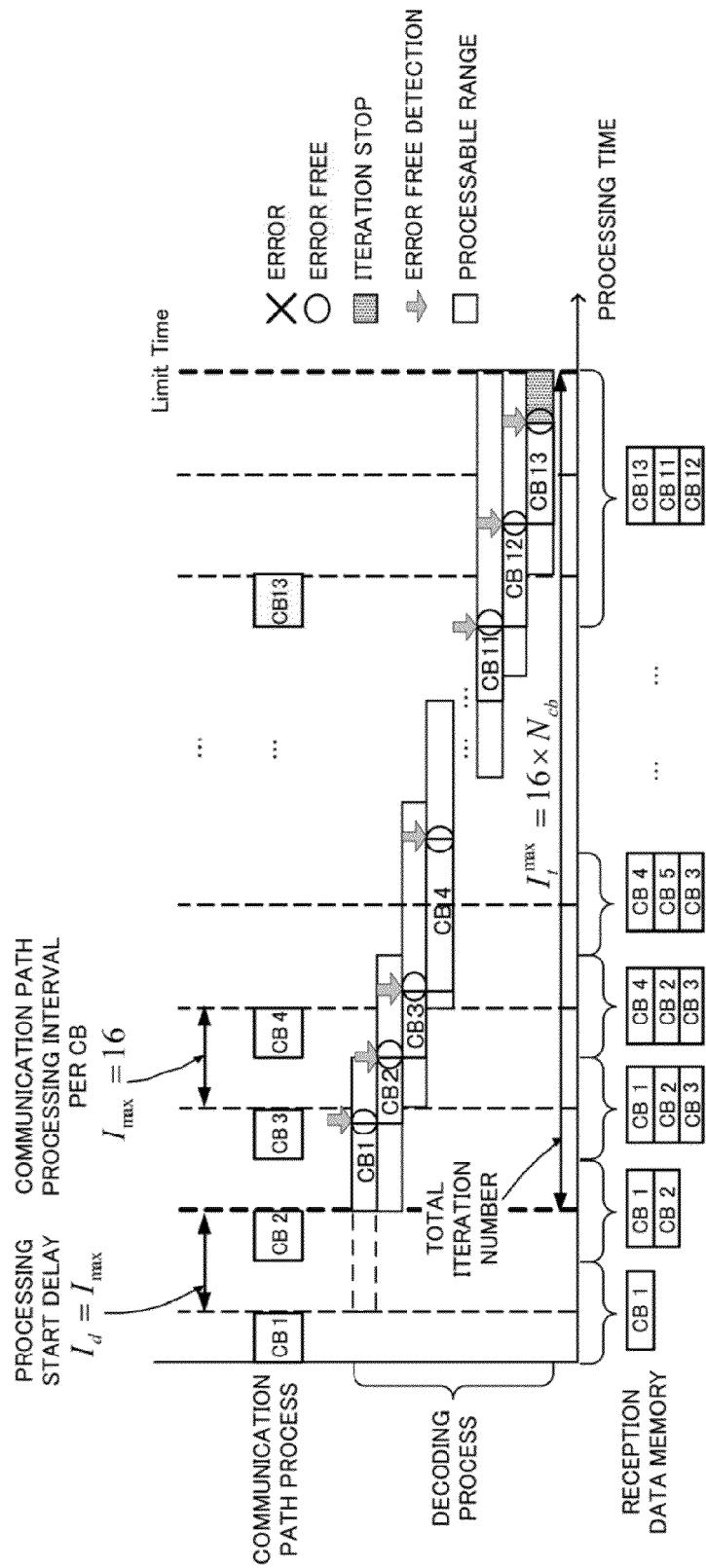
FIG. 5 is a view illustrating an example of a iterative controlling method according to the first embodiment.

FIG. 5 is a view illustrating an example of a iterative controlling method according to the first embodiment.

As regards the communication path process, for the reception process of an analog section and the demodulation process, the interval between processing starting timings of CBs becomes long with respect to the processing time period of each CB as illustrated in FIG. 5. It is assumed that the time interval just described is equivalent to delay time corresponding to a reference iteration number Imax per CB.

The decoding process can be successively carried out in order for the CBs beginning with a CB for which the communication path process by the communication path decoder 23 is completed and writing into the reception data memory 241 by the error correction decoder 24 is ended.

In particular, the decoding process for the nth CB can be carried out at a point of time at which writing of the nth CB into the reception data memory 241 is ended.

However, in the present embodiment, the decoding process of a CB 1 is started at a point of time at which writing of input data of a CB 2 is ended.

Generally, the delay time period from an end of writing of the CB 1 to time at which the process is actually started is represented by Id. Here, Id=Imax.

Consequently, where the decoding process of the CB 1 is ended at an early stage by the error free decision, the decoding process of the CB 2 can be immediately started successively. In other word, a waiting time period until the next decoding process is started after the decoding process of the CB 1 is completed can be reduced, and an effective decoding process can be achieved.

On the other hand, an ending point of time (specified time) of the decoding process is determined based on staying time of the CBs in the reception data memory 241.

As seen in FIG. 4, the reception data memory 241 secures a region for $n_{cb}$ (where $n_{cb} < N_{cb}$, and $n_{cb}$ is an integer equal to or greater than 1) CBs.

In particular, the reception data memory 241 functions as an example of a memory that stores a number ($n_{cb}$) of sub blocks smaller than the number ($N_{cb}$) of sub blocks.

Since, in an example illustrated in FIG. 5, $n_{cb}$=3, for example, the CB 1 stays in the reception data memory 241 for a time period from starting of the communication path process of the CB 1 to starting of the communication path processing of a CB 4.

Similarly, the staying period of the nth CB in the reception data memory 241 is equivalent to a time period from starting of the communication path process of the nth CB to starting of the communication path process of the n+3th CB.

In particular, the staying period Imem of each CB in the reception data memory 241 is Imem=$n_{cb}$×Imax=3×Imax.

In this manner, since the CB 1 is deleted from the reception data memory 241 at a starting time point of the communication path process of the CB 4, the time period within which the decoding process of the CB1 can be carried out continues to a starting time point of the communication path process of the CB 4.

Similarly, the time period within which the decoding process of the nth CB can be carried out continues to a starting time point of the communication path process of the n+3th CB.

It is to be noted the staying time period of each CB in the reception data memory 241 can be set such that a characteristic having a level equivalent to that of an error rate characteristic where the staying time period is not set is obtained.

In this instance, for example, the staying time period is set in advance based on the number of CBs each TRB has, the size of each TRB or each CB, a circuit performance of the receiver apparatus 20 and a propagation path state (SIR (Signal to Interference Ratio) and so forth).

Further, for example, the staying time period described above is acquired in advance by a simulation or the like such that a desired error correction characteristic (for example, a characteristic having a level equivalent to that of an error rate characteristic where the staying time period is not set) is obtained in a predetermined range of an assumed propagation path state.

Furthermore, for example, the staying time period described above is acquired in advance by a simulation or the like such that a desired error correction characteristic (for example, a characteristic having a level equivalent to that of an error rate characteristic where the staying time period is not set) is obtained in the overall range of the assumed propagation path state.

Further, in the simulation described above or the like, a maximum iteration number of times of the decoding process for each CB or the number ($n_{cb}$) of CBs stored in the reception data memory 241 may be acquired in place of acquirement of the staying time period.

From the foregoing, the iterative decoder 242 functions as an example of a iterative decoder that successively carries out the iterative decoding process within a specified time period determined based on the number ($n_{cb}$) for the number ($n_{cb}$) of stored sub blocks.

It is to be noted that, since the communication path process for CBs following the CB 13 is not carried out in the example illustrated in FIG. 5, the time period within which the decoding processes for the CBs 11 to 13 can be carried out is determined in accordance with a predetermined specified time period (Limit Time period).

However, where the communication path process for the CBs included in the next TRB is carried out successively from the communication path process of the CB 13, ending time points of the decoding processes for the CBs 11 to 13 are set accordingly.

In particular, the ending time points of the decoding process for the CBs 11 to 13 are determined based on the starting time points of the communication path process for the CBs 1 to 3 included in the next TRB.

From the foregoing, the processable time period in the decoding process of each CB can be represented as specified below.

In particular, taking the iterative process for one time of element decoding as unit time, if starting time and ending time of the processable time period for each CB are determined by the following expressions:

$$I_i^{(st)}$$

$$I_i^{(end)}(i=1,2,\ldots,N_{cb})$$ [Expression 1]

then, where the communication path process ending time point of the CB 1 is determined as time 0, the starting time and the ending time are calculated by the following expressions:

$$I_1^{(st)} = I_d = I_{max}$$ [Expression 2]
$$I_1^{(end)} = I_{mem}$$
$$I_i^{(st)} = (i-1) \times I_{max} (i=2, \ldots, N_{cb})$$
$$I_i^{(end)} = \min(I_d + I_{max}^{(T)}, I_d + (n_{cb} + i - 2) \times I_{mem})$$
$$= \min((N_{cd}+1) \times I_{max}, (i-1+n_{cb}) \times I_{max})$$
$$(i=2, \ldots, N_{cb})$$

A processing flow of the error correction decoder 24 in the present embodiment is described below in detail.

It is to be noted that $I_t$ is the total iteration number of times by which the CBs in the iterative decoder 242 are not distinguished from each other and is an integer equal to or greater than 1.

Figure 6:
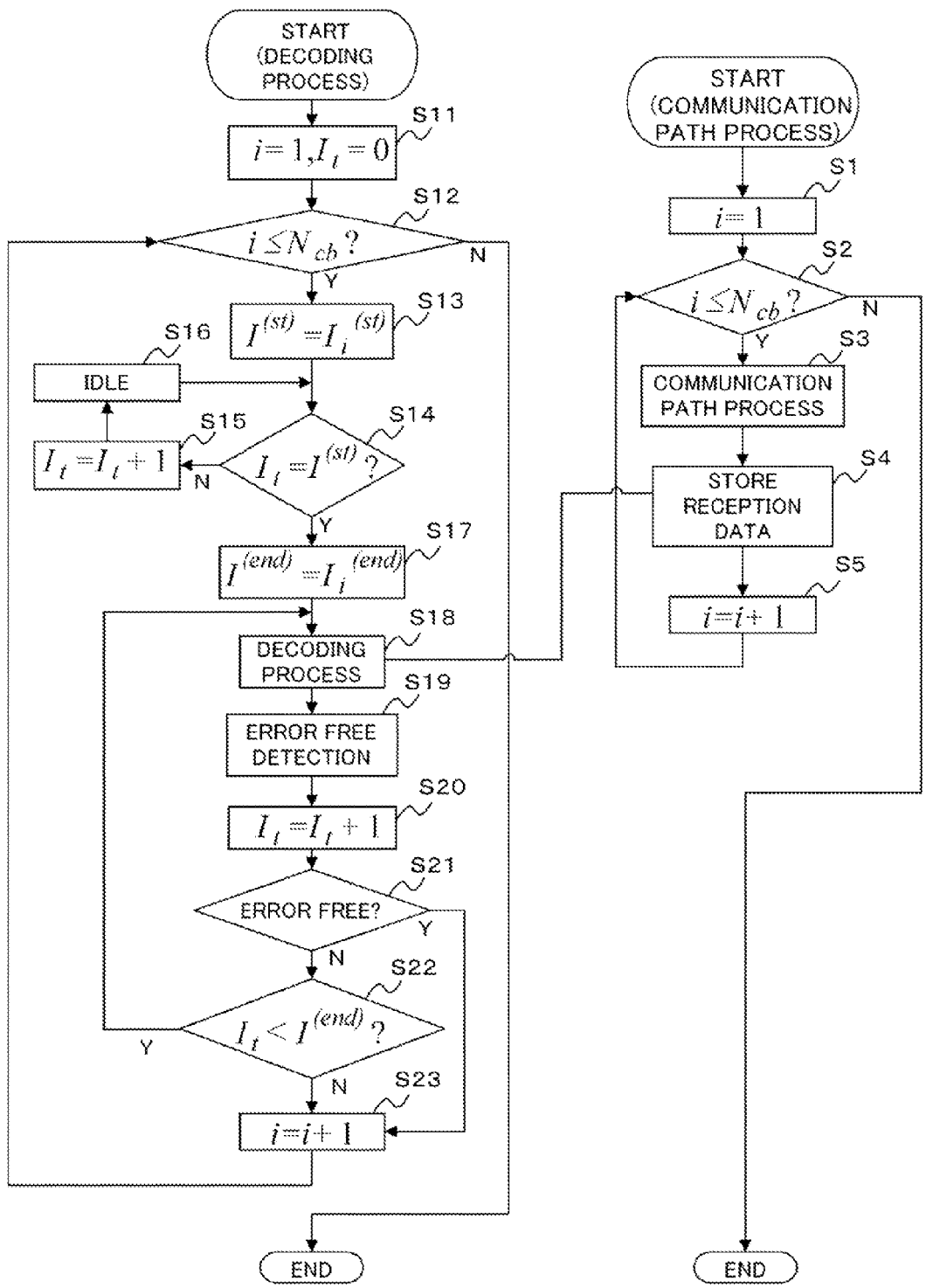
FIG. 6 is a view illustrating a processing flow of the receiver apparatus according to the first embodiment.

FIG. 6 is a view illustrating a processing flow of the receiver apparatus 20 according to the first embodiment.

In the communication path process, initialization of i (i indicates an integer equal to or greater than 1) that represents a target CB is carried out first (step S1). In particular, the value 1 indicating the top CB is substituted into i.

Then, it is decided whether or not i is equal to or lower than $N_{cb}$ (step S2), and if it is decided that i is equal to or lower than $N_{cb}$ (Y route of step S2: since this route is represented by Y in FIG. 6, although this route is referred to as Y route, the Y route signifies a Yes route; the Yes route is hereinafter referred to as Y route), then the communication path decoder 23 carries out the communication path process for the ith CB (step S3).

Then, the reception data for which the communication path process is carried out is outputted to the reception data memory 241 of the error correction decoder 24 (step S4).

Thereafter, the processing target is changed to a next CB (step S5), and then the processing advances to step S2.

On the other hand, if it is decided at step S2 that is greater than $N_{cb}$ (N route of step S2: since this route is represented by N in FIG. 6, although this route is referred to as N route, the N route signifies a No route; the No route is hereinafter referred to as N route), then the communication path process is ended.

On the other hand, in the decoding process, initialization of i and $I_t$ is carried out first (step S11). In particular, 1 and 0 are substituted into i and $I_t$, respectively.

It is decided whether or not i is equal to or lower than $N_{cb}$ (step S12). If it is decided that i is not equal to or lower than $N_{cb}$ (N route of step S12), then the decoding process is ended.

On the other hand, if it is decided that i is equal to or lower than $N_{cb}$ (Y route of step S12), then starting time of the processable time period of the decoding process for the ith CB is placed into $I^{(st)}$ (step S13), and it is decided whether or not the total iteration number $I_t$ of times at present is $I^{(st)}$ (step S14).

Here, if it is decided that the total iteration number $I_t$ of times at present is not equal to $I^{(st)}$ (N route of step S14), then the processing waits until the total iteration number $I_t$ of times at present becomes equal to $I^{(st)}$ (steps S15 and S16).

Then, if the total iteration number $I_t$ of times at present becomes equal to $I^{(st)}$ (Y route of step S14), then ending time of the processable time period of the decoding process at present is placed into $I^{(end)}$ (step S17), and the iterative decoder 242 carries out the iterative decoding process for the ith CB stored in the reception data memory 241 at step S4 of the communication path process described above (step S18).

Thereafter, the error free decider 243 carries out error free detection for a result of the iterative decoding process described above (step S19), and increments the total iteration time number $I_t$ (step S20).

Then, if an error free condition is detected by the error free decider 243 (Y route at step S21), then the processing target is changed to the next CB (step S23) and then the processing advances to step S12.

On the other hand, if the error free condition is not detected by the error free detector 243 (N route at step S21), then it is decided whether or not the total iteration number $I_t$ at present is smaller than $I^{(end)}$ (step S22). If it is decided that the total iteration number $I_t$ at present is smaller than $I^{(end)}$, then the processing advances to step S18 and the iterative decoding process is carried out again for the present CB.

On the other hand, if it is decided that the total iteration number $I_t$ at present is not smaller than $I^{(end)}$ (N route at step S22), then the processing advances to step S23.

With the configuration described above, the error correction decoder 24 in the present embodiment limits the processable time period of the iterative decoding process for each CB so that the memory size necessary for the iterative decoding process can be decreased.

In particular, while, in a conventional apparatus, the memory size for Ncb CBs need be secured to carry out the iterative decoding process, in the reception data memory 241 of the present embodiment, the memory size for $n_{cb}$ CBs in the maximum may be secured.

Consequently, since the memory size in the receiver apparatus can be decreased, reduction of the circuit scale, suppression of the power consumption and so forth can be anticipated.

[2] First Modification to First Embodiment

While, in the foregoing description of the embodiment, the configuration is described in which the receiver apparatus 20 includes the single communication path processor 23, in the following description of the present modification, a configuration is described in which the receiver apparatus 20 includes a plurality of communication path processors.

Figure 7:
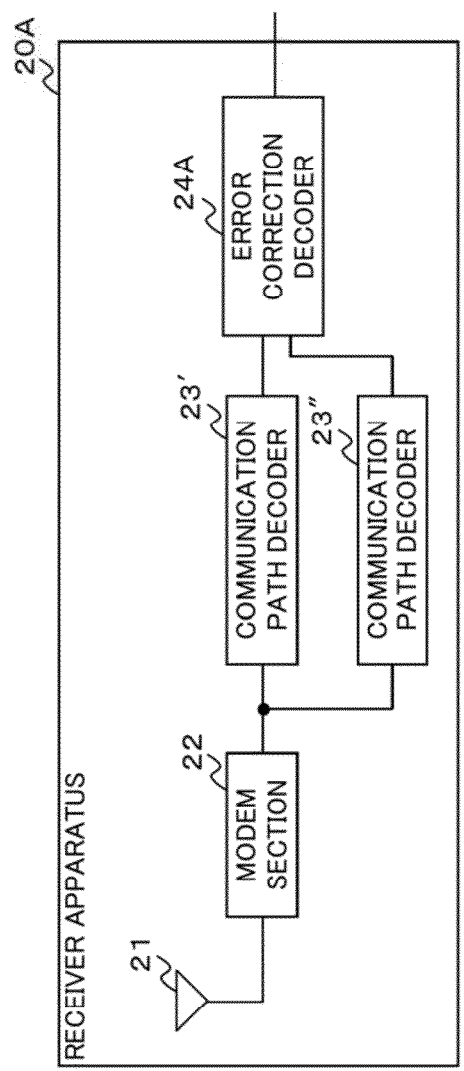
FIG. 7 is a block diagram illustrating an example of a configuration of a receiver apparatus according to a first modification to the first embodiment.

FIG. 7 is a block diagram illustrating an example of a configuration of a receiver apparatus 20A according to the first modification to the first embodiment.

The receiver apparatus 20A illustrated in FIG. 7 illustratively includes a receiver antenna 21, a modem section 22, communication path decoders 23' and 23" and an error correction decoder 24A. It is to be noted that, in FIG. 7, like elements to those in the configuration of the first embodiment are denoted by like reference characters, and detailed description of them is omitted.

The communication path encoders 23' and 23" take partial charge of the function of the communication path decoder 23 described above to carry out parallelization of the communication path decoding process.

It is to be noted that the decoding processing capacity for CBs of the communication path decoder 23 according to the embodiment described above and the total of the decoding processing capacities of the communication path decoders 23' and 23" in the present modification are equal to each other. In particular, the communication path processing time period for two CBs by the communication path decoder 23 is equal to the communication path processing time period for one CB by each of the individual communication path decoders 23' and 23".

The error correction decoder 24A successively carries out the decoding process for inputted CBs similarly to the error correction decoder 24 described above. However, since CBs are outputted in parallel from the communication path decoders 23' and 23" in the present modification, the error correction decoder 24A suitably carries out priority ranking for the CBs outputted in parallel.

It is to be noted that the components of the error correction decoder 24A can be implemented similarly to those of the error correction decoder 24 described above. In particular, the error correction decoder 24A includes a reception data memory 241, a iterative decoder 242 and an error free decider 243.

Figure 8:
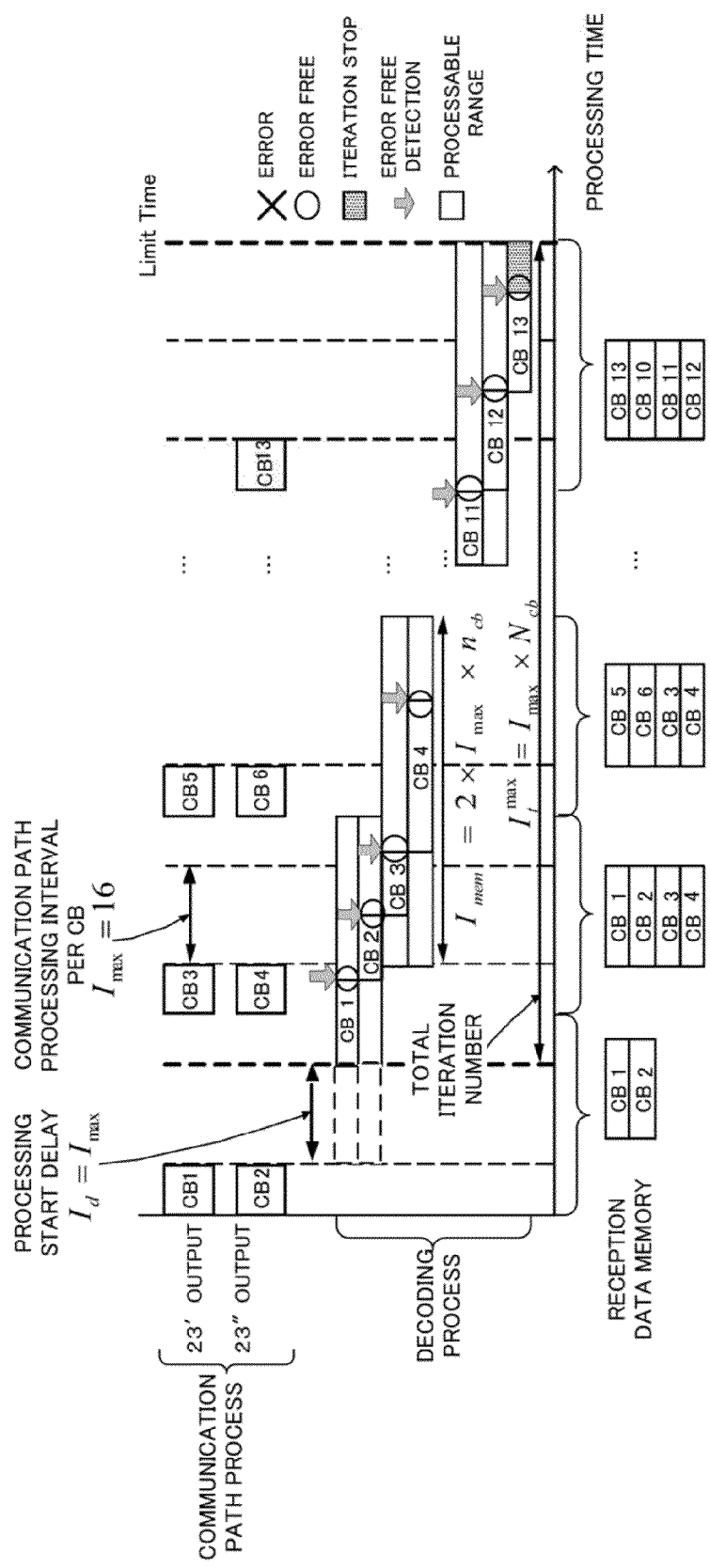
FIG. 8 is a view illustrating an example of a iterative controlling method according to the first modification to the first embodiment.

FIG. 8 is a view illustrating an example of a iterative controlling method according to the first modification to the first embodiment.

The decoding process is successively carried out for CBs which are outputted from the communication path decoders 23' and 23" and whose writing into the reception data memory 241 is completed. It is to be noted that, in the present modification, the decoding process is successively carried out with priority beginning with a CB outputted from the communication path decoder 23'.

In the present modification, a processing delay time period of the top CB is equal to a time period of the reference iterative time number (Imax) for 1 CB in the embodiment described above.

Consequently, for example, even if the decoding process for the CB 2 is ended at an early stage by an error free decision, the necessity to wait the decoding process till the completion of the communication path process for the CB 3 for which the decoding process is to be carried out next is eliminated, and an effective decoding process can be anticipated.

Further, the time period Imem in which each CB stays in the reception data memory 241 of the error correction decoding section 24 is calculated by the following expression:

$$Imem = n_{cb} \times 2 \times Imax = 4 \times Imax$$

where the communication path processing time period ($2 \times Imax$) is taken as a unit and the value of $n_{cb}$ is 2.

Figure 9:
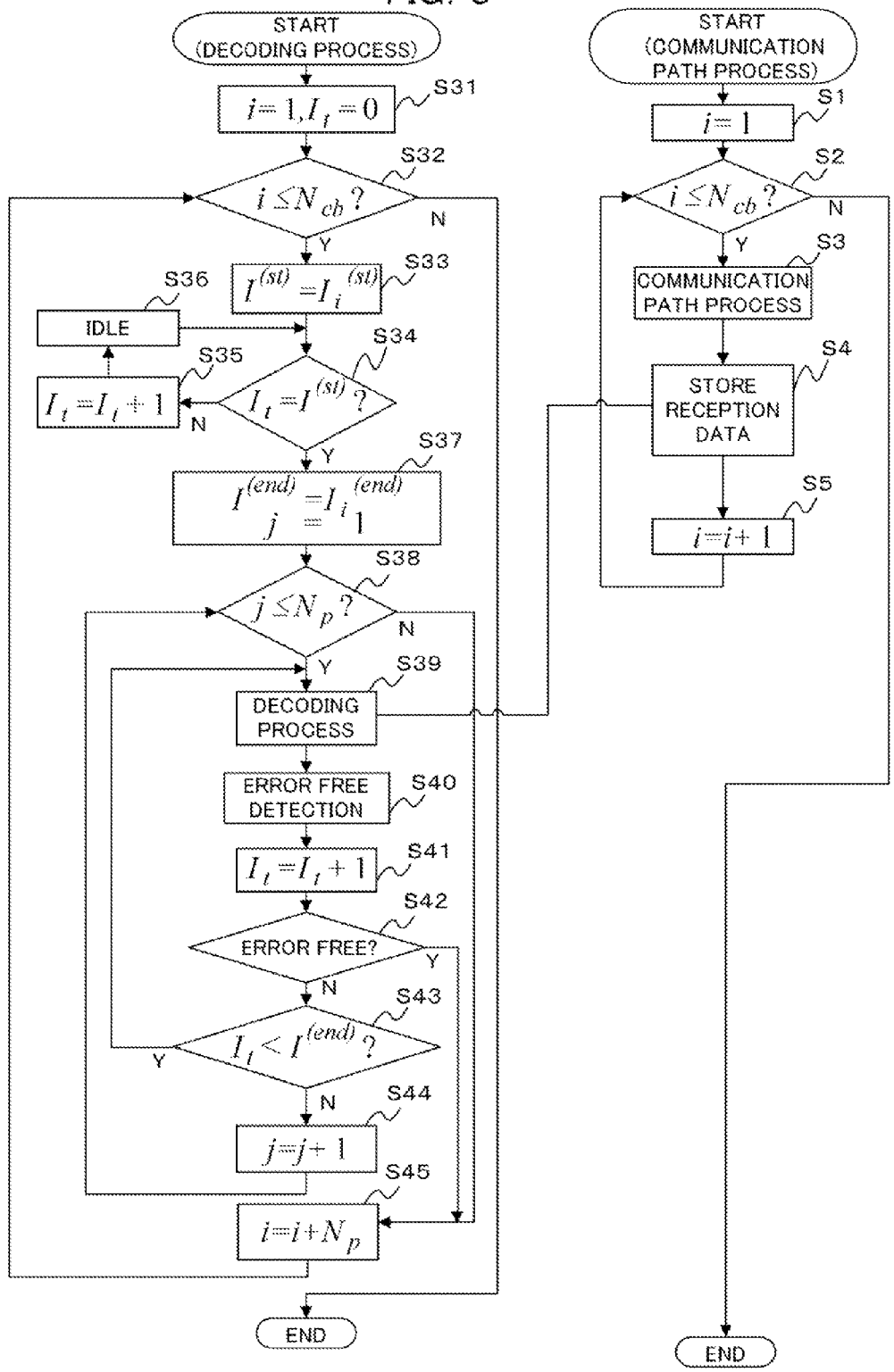
FIG. 9 is a view illustrating a processing flow of the receiver apparatus according to the first modification to the first embodiment.

FIG. 9 is a view illustrating a processing flow of the receiver apparatus 20A according to the first modification to the first embodiment.

It is to be noted that, since the communication path process (steps S1 to S5) is similar to that in the embodiment described above, description of the process is omitted. However, the communication path process is allotted to and carried out by the communication path processors 23' and 23".

In the decoding process, initialization of i representing the target CB and $I_t$ representing the total iteration time number at which CBs are not distinguished from each other in the iterative decoder 242 is carried out first (step S31). In particular, 1 is substituted into i and 0 is substituted into $I_t$.

Then, it is decided whether or not i is equal to or lower than $N_{cb}$ (step S32). If it is decided that i is not equal to or lower than $N_{cb}$ (N route at step S32), then the decoding process is ended.

On the other hand, if it is decided that i is equal to or lower than $N_{cb}$ (Y route at step S32), then starting time of the processable time period of the decoding process of the ith CB is placed into $I^{(st)}$ (step S33), and it is decided whether or not the total iteration time number $I_t$ is $I^{(st)}$ at present (step S34).

Here, if it is decided that the total iteration time number $I_t$ at present is not equal to $I^{(st)}$ (N route at step S34), then the processing waits until the total iteration time number $I_t$ at present becomes equal to $I^{(st)}$ (steps S35 and S36).

Then, if the total iterative time number $I_t$ at present becomes equal to $I^{(st)}$ (Y route at step S34), then ending time of the processable time period of the decoding process for the present CB is placed into $I^{(end)}$ and 1 is substituted into the value of j (j is an integer equal to or greater than 1) representing the communication path process for the target (in the example of FIG. 7, j=1, 2) (step S37).

Thereafter, it is decided whether or not the value of j (in the example of FIG. 7, j=1, 2) is equal to or lower than $N_p$ that represents the parallel processing number (step S38). Then, if it is decided that the value of j is not equal to or lower than $N_p$, then the processing target is changed to the next CB (step S45) and the processing advances to step S32.

On the other hand, if it is decided that the value of j is equal to or lower than $N_p$, then the iterative decoder 242 carries out the iterative decoding process for the ith CB stored in the reception data memory 241 at step S4 of the communication path process (step S39).

Then, the error free decider 243 carries out error free detection for a result of the iterative decoding process just described (step S40) and increments the total iterative time number $I_t$ (step S41).

Then, if an error free condition is detected by the error free decider 243 (Y route at step S42), then the processing advances to step S45.

On the other hand, if an error free condition is not detected by the error free decider 243 (N route at step S42), then it is decided whether or not the total iterative time number $I_t$ at present is smaller than $I^{(end)}$ (step S43). If it is decided that the total iterative time number $I_t$ at present is smaller than $I^{(end)}$, then the processing advances to step S39 and the iterative decoding process is carried out again for the present CB.

On the other hand, if it is decided that the total iterative time number $I_t$ at present is not smaller than $I^{(end)}$ (N route at step S43), then the value of j is incremented (step S44) and the processing advances to step S38.

With the configuration described above, even if the receiver apparatus 20A includes the plural communication path decoders 23' and 23" and carries out the communication path decoding process in parallel, the decoding process using the single iterative decoder 242 can be carried out. Consequently, an effect similar to that of the embodiment described above can be achieved.

It is to be noted that, while the example is described in which the two communication path decoders are used, also it is possible to use three or more communication path decoders. In this instance, similarly to the example described above, the error correction decoder 24A carries out priority ranking suitably and the decoding process successively for the CBs outputted in parallel from the three or more communication path decoders.

[3] Second Modification to First Embodiment

While, in the first modification described above, where the communication path decoding process is carried out in parallel, the error correction decoder 24 carries out the decoding process with priority for a CB outputted from the communication path decoder 23', for example, the reliability of the SNR (Signal to Noise Ratio) or the like may be measured between CBs for which the communication path process is carried out at the same time such that the decoding process is carried out beginning with a CB whose characteristic is not good.

For example, since, in the example illustrated in FIG. 8, the decoding process is carried out for the CB 1 and the CB 2 within the same processable time period, the CB (CB 1) for which the decoding process is carried out first can utilize the resource in the overall interval within the processable time period. On the other hand, the CB (CB 2) for which the decoding process is carried out later can utilize only the resource of the time period remaining as a result of the decoding process carried out first.

Therefore, the decoding process is carried out with priority for the CB whose characteristic is not favorable such that a sufficient resource is allocated to the CB having the unfavorable characteristic.

Figure 10:
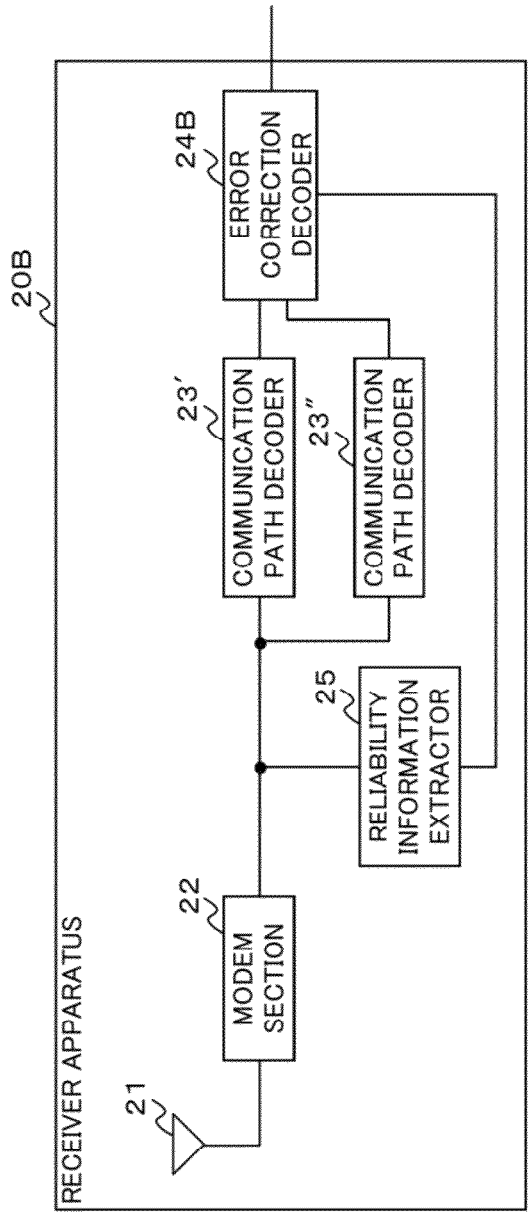
FIG. 10 is a block diagram illustrating an example of a configuration of a receiver apparatus according to a second modification to the first embodiment.

FIG. 10 is a block diagram illustrating an example of a configuration of a receiver apparatus 20B according to the second modification to the first embodiment.

The receiver apparatus 20B illustrated in FIG. 10 illustratively includes a receiver antenna 21, a modem section 22, communication path decoders 23' and 23", an error correction decoder 24B and a reliability information extractor 25. It is to be noted that, in FIG. 10, like elements to those in the embodiment described above are denoted by like reference characters, and therefore, detailed description of the components is omitted.

The reliability information extractor 25 extracts reliability information from reception data through measurement of the SNR or the like and outputs the extracted information to the error correction decoder 24B.

The error correction decoder 24B carries out, similarly to the error correction decoder 24A described above, priority ranking suitably for the CBs outputted in parallel from the plural communication path decoders and then carries out the decoding process successively for the CBs. Here, the priority ranking can be carried out based on the reliability information extracted by the reliability information extractor 25.

Figure 11:
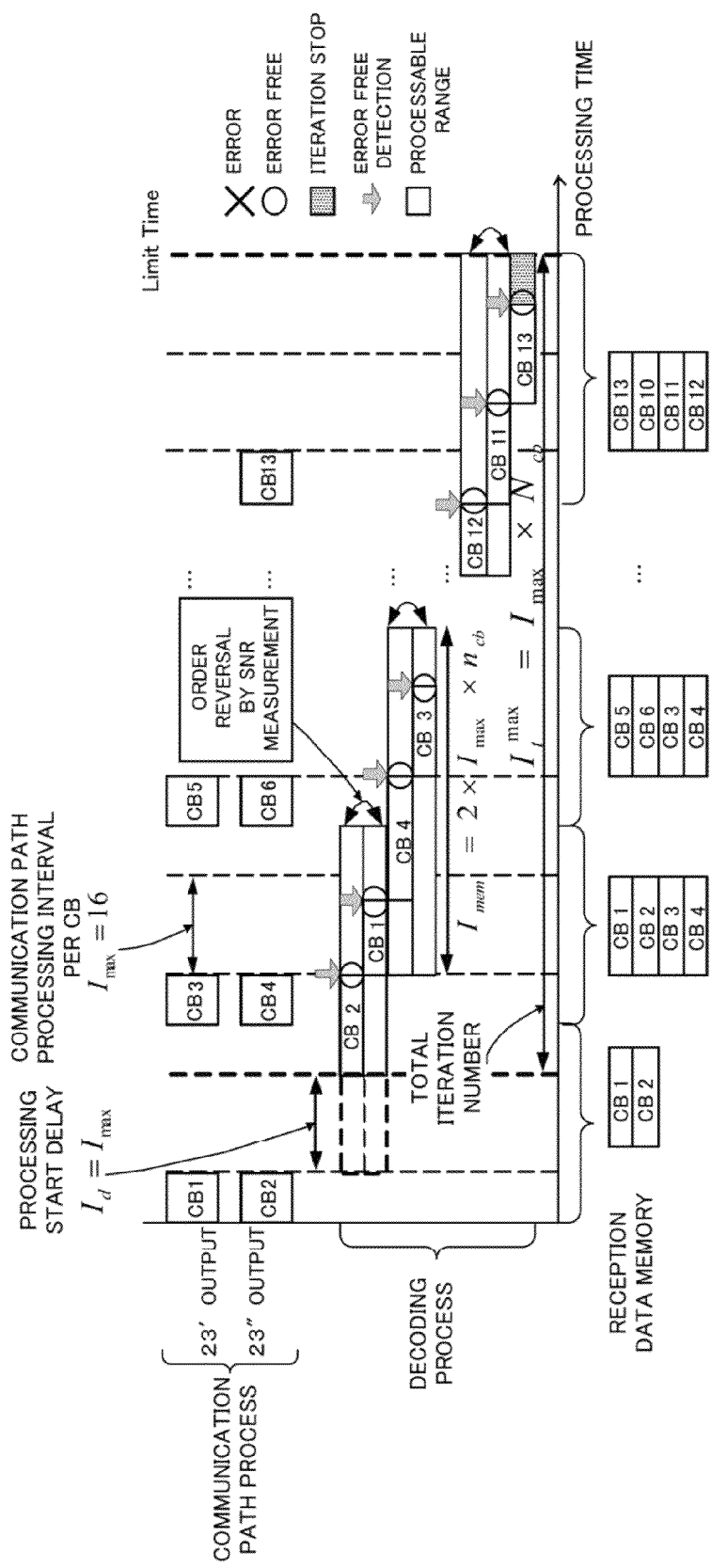
FIG. 11 is a view illustrating an example of a iterative controlling method according to the second modification to the first embodiment.

FIG. 11 is a view illustrating an example of a iterative controlling method according to the second modification to the first embodiment.

In the example illustrated in FIG. 11, the decoding process is carried out with priority beginning with a CB outputted from the communication path decoder 23" based on the reliability information extracted by the reliability information extractor 25.

For example, since the reliability of the CB 2 is lower than that of the CB 1, the decoding process is carried out with priority for the CB 2.

It is to be noted that it can be determined which one of the CBs for which the communication path process has been carried out in parallel is to be processed with priority, for the CBs processed in parallel.

Figure 12:
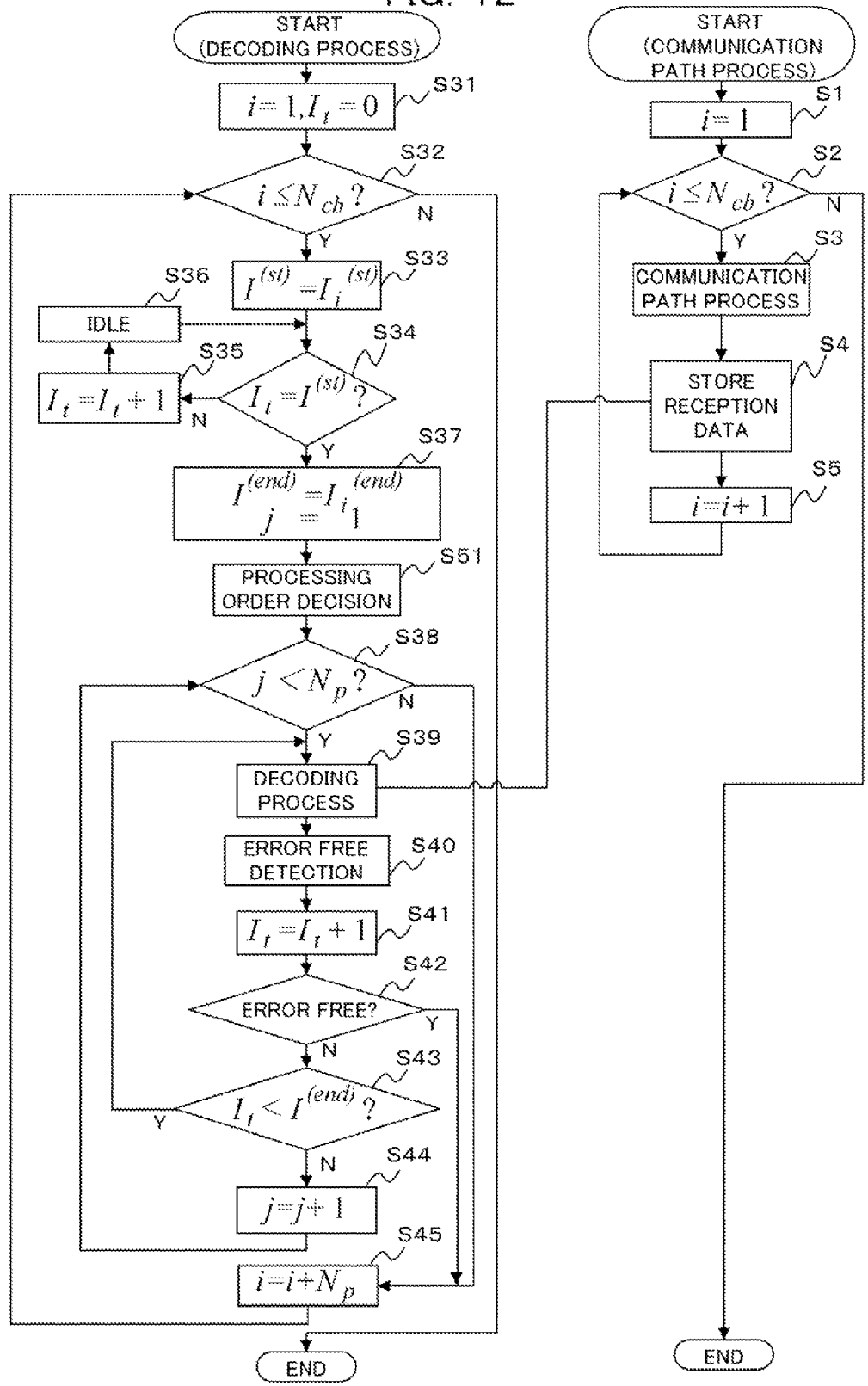
FIG. 12 is a view illustrating a processing flow of the receiver apparatus according to the second modification to the first embodiment.

FIG. 12 is a view illustrating a processing flow of the receiver apparatus 20B according to the second modification to the first embodiment.

The processing flow illustrated in FIG. 12 is configured by adding a step S51 in the decoding process to the processing flow illustrated in FIG. 9.

At step S51, a processing order in carrying out of the decoding process is determined for the CBs outputted from the communication path decoders 23' and 23" based on the information extracted by the reliability information extractor 25.

In particular, at step S51, association between the value of j and each of the CBs outputted from the communication path decoders 23' and 23" is carried out. In the example illustrated in FIG. 11, where the value of j is 1, the decoding process is carried out for the CB outputted from the communication path decoder 23', but, where the value of j is 2, the decoding process is carried out for the CB outputted from the communication path decoder 23".

It is to be noted that the processes other than the process just described are carried out similarly to those of the first modification described above.

With the configuration described above, since the decoding process is carried out with priority for a CB having an unfavorable characteristic from among CBs for which the communication path process is carried out in parallel, a sufficient resource can be assigned to the CB that has an unfavorable characteristic and an error in the decoding process can be suppressed. Consequently, the reliability of the decoding process can be enhanced.

It is to be noted that, while the example is described above in which the two communication path decoders are used, also it is possible to use three or more communication path decoders. In this instance, similarly as in the example described above, the error correction decoder 24B carries out priority ranking for the CBs outputted in parallel from the three or more communication path decoders based on the reliability information outputted from the reliability information extractor 25 and then carries out the decoding process successively for the CBs.

It is to be noted that the example described above can be applied, for example, also to a case in which a plurality of CBs are written in the reception data memory 241 of the error correction decoder 24B by the single communication path decoder. In this instance, similarly as in the example described above, the error correction decoder 24B carries out priority ranking for the written CBs based on the reliability information outputted from the reliability information extractor 25 and then carries out the decoding process successively for the CBs.

[4] Third Modification to First Embodiment

In the embodiment and the modifications described above, where an error is detected in a CB while the decoding process for the CBs included in the TRB continues, that is, where an error free condition is not reached within the processable time period, the processing for the certain TRB may be stopped without carrying out the decoding process for CBs following the CB in which the error occurs.

It is to be noted that, while a configuration based on the embodiment described above is described below, the configuration can be applied similarly as in the first and second modifications.

Figure 13:
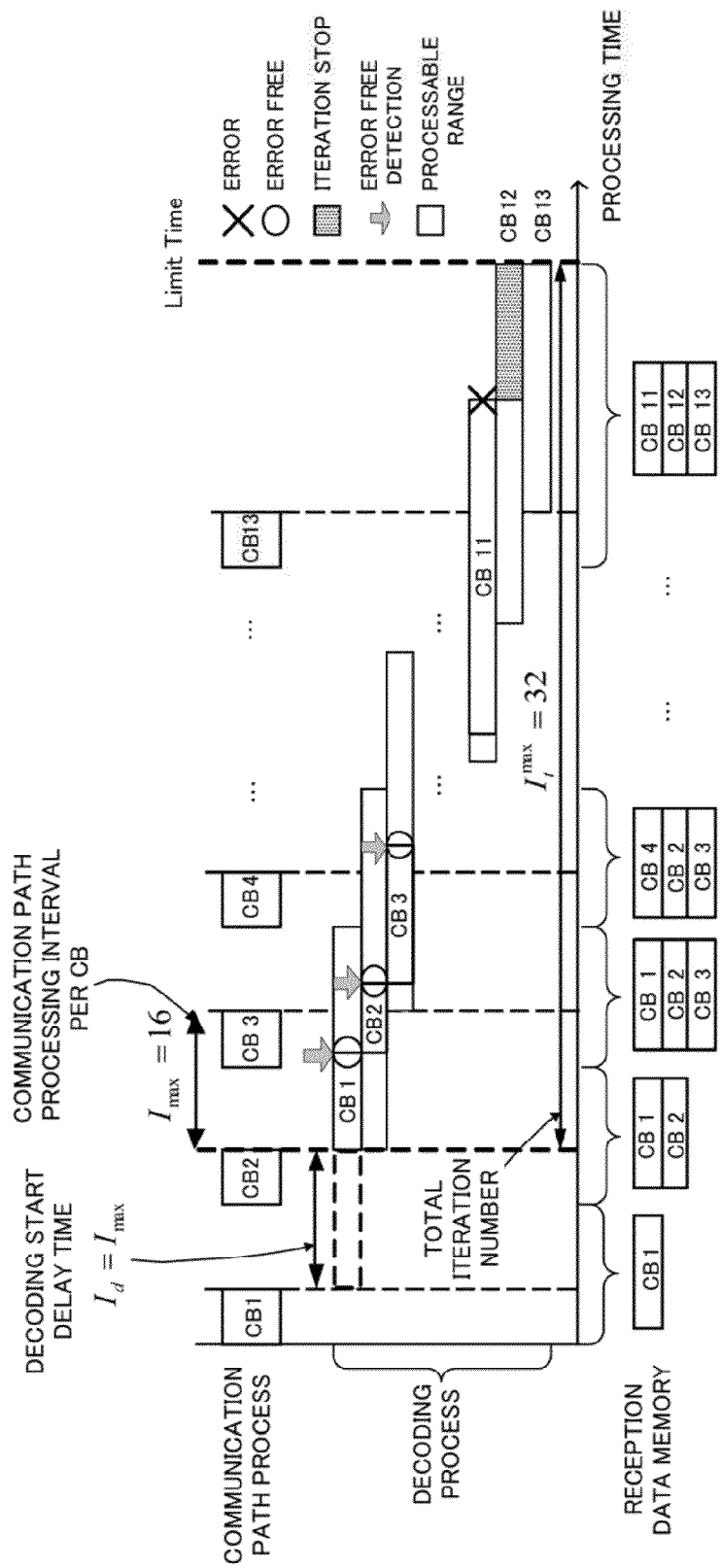
FIG. 13 is a view illustrating an example of a iterative controlling method according to a third modification to the first embodiment.

FIG. 13 is a view illustrating an example of a iterative controlling method according to the third modification to the first embodiment.

FIG. 13 illustrates a case in which, in the decoding process of a CB 11, an error free condition is not detected within the processable time period of the CB 11.

In this instance, the decoding process of the following CBs 12 and 13 is not carried out.

Further, the receiver apparatus 20 (also the receiver apparatus 20A and 20B similarly) transmits, for example, a re-sending request for the TRB including a CB in which an error occurs to the transmission apparatus 10 so that data corresponding to the same information bits is received again. Consequently, the re-sending request can be quickly transmitted and the re-sent data can be quickly received where a decoding error of the CB is detected in the decoding process.

Figure 14:
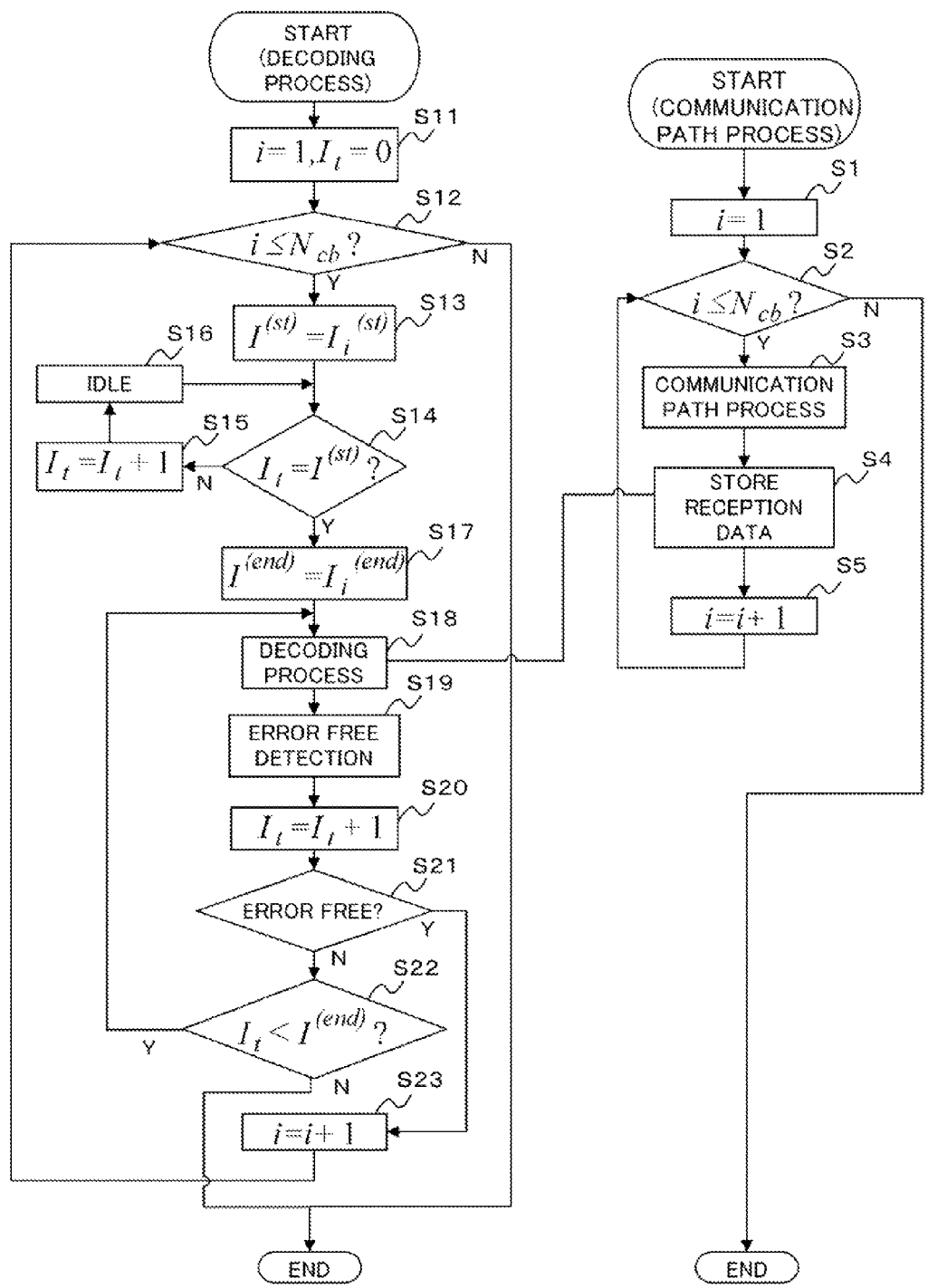
FIG. 14 is a view illustrating a processing flow of a receiver apparatus according to the third modification to the first embodiment.

FIG. 14 is a view illustrating a processing flow of the receiver apparatus according to the third modification to the first embodiment.

The flow illustrated in FIG. 14 is different from that illustrated in FIG. 6 in processes at steps beginning with step S22.

In particular, in the flow illustrated in FIG. 14, if it is decided at step S21 that an error free condition is not detected and it is further decided at step S22 that the total iterative time $I_t$ at present is not smaller than $I^{(end)}$ (N route at step S22), then the decoding process is ended.

It is to be noted that the processes other than the process just described are similar to those of the embodiment described above.

With the configuration described above, if a decoding error of a CB is detected in the decoding process, then the decoding process for CBs after the CB is stopped. Consequently, unnecessary processes can be omitted and saving of the resource can be achieved.

It is to be noted that, in the embodiment and modifications described above, for example, an error decider for deciding whether or not an error occurs may be used in place of the error free decider 243 for deciding whether or not an error free condition is detected.

[5] Second Embodiment

While, in the first embodiment described above, the example is described in which the error correction decoding sections 24, 24A and 24B carry out the decoding process successively for CBs included in a single TRB, in the present embodiment, an example is described in which a plurality of TRBs are inputted in parallel to the iterative decoder. It is to be noted that the kth TRBs inputted in parallel are referred to TRBk. It is to be noted that the sizes of the TRBs inputted in parallel may be different from each other.

The receiver apparatus in the present embodiment can be utilized, for example, as a receiver apparatus for an MIMO (Multiple Input Multiple Output) system.

Figure 15:
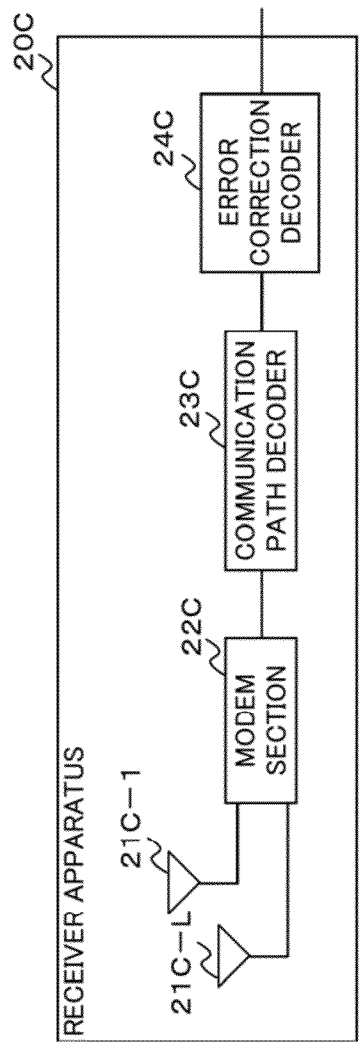
FIG. 15 is a block diagram illustrating an example of a configuration of a receiver apparatus according to a second embodiment.

FIG. 15 is a block diagram illustrating an example of a configuration of the receiver apparatus 20C according to the second embodiment.

The receiver apparatus 20C illustrated in FIG. 15 illustratively includes L (L is an integer equal to or greater than 1) receiver antennas 21C-1 to 21C-L, a modem section 22C and an error correction decoder 24C. It is to be noted that, where the receiver antennas 21C-1 to 21C-L are not distinguished from each other, each receiver antenna is hereinafter referred to simply as receiver antenna 21C.

The modem section 22C carries out predetermined wireless reception processes such as an amplification process, a frequency conversion (down convert) process and so forth for radio signals received through the receiver antennas 21C and then carries out a demodulation process corresponding to the modulation process on the transmission side for resulting signals. It is to be noted that, where the receiver antenna number L is two or more and MIMO demodulation is carried out on the transmission side, the modem sections 22C carry out an MIMO demodulation process.

The signals outputted from the modem sections 22C are outputted to the communication path decoder 23C.

The communication path decoders 23C carry out the decoding process corresponding to the communication path encoding process on the transmission side, and can carry out the communication path decoding process in parallel for the CBs included in each TRB. In particular, the communication path decoders 23C function as an example of a communication path processor that carries out the communication path process in parallel for the sub blocks of a first encoded signal and a second encoded signal.

It is to be noted that the communication path decoders 23C output a plurality of TRBs in parallel.

The error correction decoder 24C carries out the decoding process corresponding to the encoding process on the transmission side for the plural TRBs outputted from the communication path decoders 23C.

Figure 16:
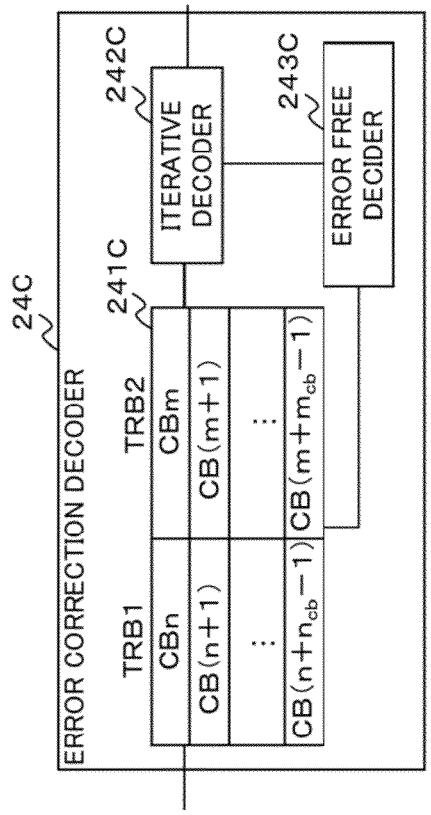
FIG. 16 is a block diagram illustrating an example of a configuration of an error correction decoder according to the second embodiment.

FIG. 16 is a block diagram illustrating an example of a configuration of the error correction decoding apparatus 24C illustrated in FIG. 15.

The error correction decoder 24C illustrated in FIG. 16 illustratively includes a reception data memory 241C, a iterative decoder 242C and an error free decider 243C.

The reception data memory 241C temporarily stores, for the iterative decoding process, the CBs included individually in the plural TRBs outputted in parallel from the communication path decoder 23C.

In the example illustrated in FIG. 16, from among CBs included in two TRBs (TRB 1 and TRB 2), $n_{cb}$ and $m_{cb}$ CBs (if the number of CBs included in the TRB 2 is $M_{cb}$ ($M_{cb}$ is an integer equal to or greater than 1), then $m_{cb} < M_{cb}$, and $m_{cb}$ is an integer equal to or greater than 1) in the maximum are stored, respectively. In particular, the reception data memory 241C functions as an example of a memory that stores a number of ($n_{cb}$) sub blocks smaller than the number ($N_{cb}$) of sub blocks and a number of ($m_{cb}$) sub blocks smaller than the number ($M_{cb}$) of sub blocks described above.

The iterative decoder 242C extracts the reception data from the reception data memory 241C and carries out the iterative decoding process successively for the extracted reception data.

The error free decider 243C carries out an error decision based on a CRC and so forth every time the iterative process by the iterative decoder 242C is carried out.

Figure 17:
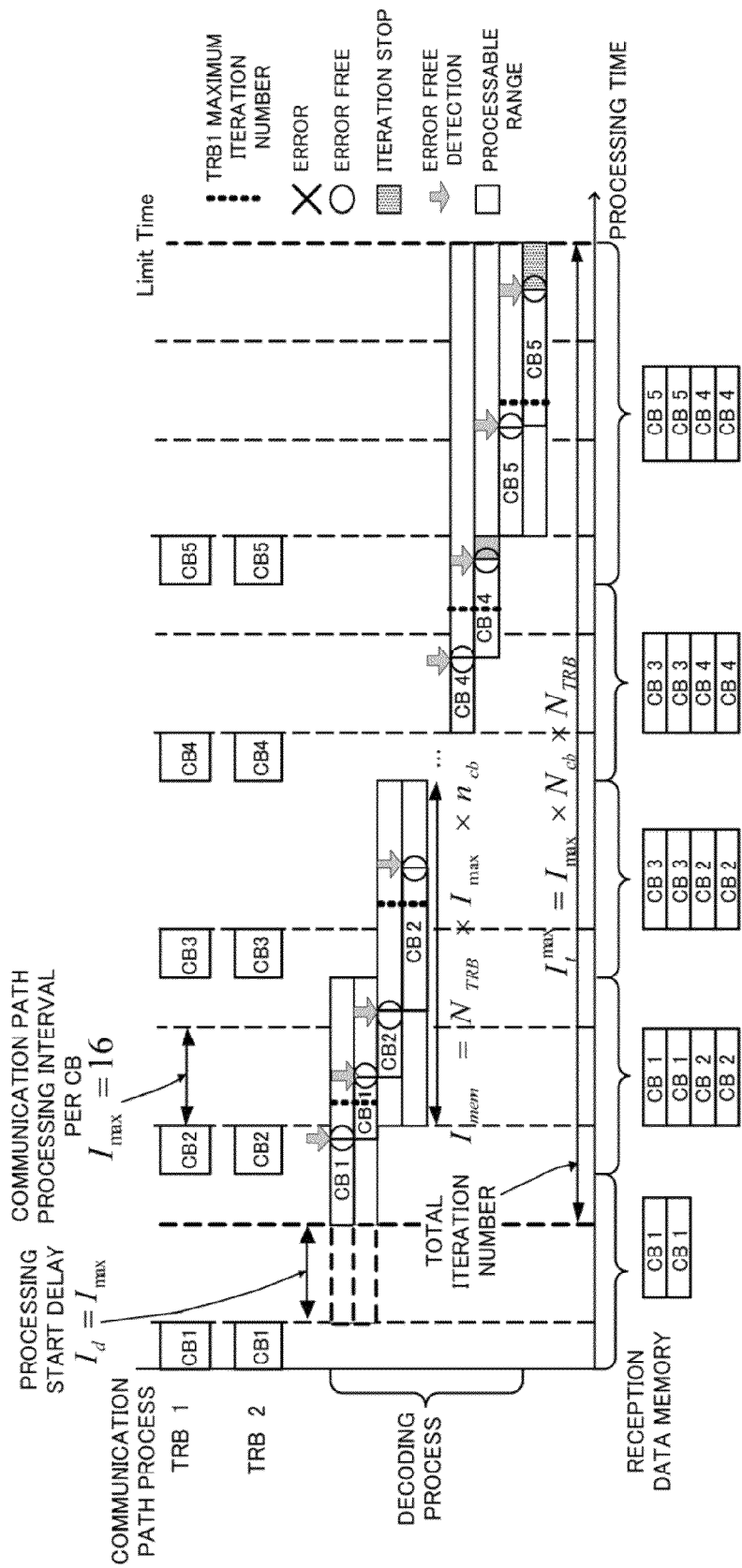
FIG. 17 is a view illustrating an example of a iterative controlling method according to the second embodiment.

FIG. 17 is a view illustrating an example of a iterative controlling method according to the second embodiment.

$N_{TRB}$ (where $N_{TRB}$ is an integer equal to or greater than 2) TRBs are inputted in parallel to the error correction decoder 24C.

It is to be noted that, since the $N_{TRB}$ TRBs are processed in parallel in the communication path processor 23C, an example is described in which a communication path processing time period for each TRB is $1/N_{TRB}$.

Further, for the simplified description, the number of CBs of each TRB stored in the reception data memory 241C is $n_{cb}$. It is to be noted that $n_{cb}=2$ in the example illustrated in FIG. 17.

Further, the number of ($N_{cb}$, $M_{cb}$ ($N_{cb}$ and $M_{cb}$ are integers individually equal to or greater than 1)) CBs included in each TRB is determined to 5.

Also in the present embodiment, a starting timing of the decoding process is set in association with an ending time point of the communication path process for each CB.

Further, while an ending time point (specified time) of the decoding process is determined based on a staying time period of each CB in the reception data memory 241C, the memory staying time period of each CB is given by the following expression under the conditions described above:

$$Imem = n_{cb} \times N_{TRB} \times Imax$$

It is to be noted that, even if the values of $n_{cb}$ and $m_{cb}$ are different from each other, the decoding process can be carried out similarly as in the embodiment described above. In this instance, the memory staying time period for each CB is given based on $n_{cb}$ and $m_{cb}$.

Consequently, the iterative decoder 242C functions as an example of a iterative decoder that successively carries out the iterative decoding process within a specified time period for each sub block.

Also in the present embodiment, a processing delay time period is applied to the top CB, and as a result, reduction of waiting time can be implemented.

While, in the example illustrated in FIG. 17, the processable time periods for the two CBs whose communication path processes are ended at the same time are equivalent to each other, the decoding process is carried out with priority beginning with the CBs of the TRB 1. Therefore, where a limitation is not provided specifically, a greater resource than that in the decoding process for the CBs of the TRB 2 can be utilized for the decoding process for the CBs of the TRB 1, and the decoding process on the TRB 1 side is usually superior in characteristic.

Therefore, by applying a limitation to the iterative process number for the TRB 1 within a range of the processable time period of the TRB 1, the characteristic of the decoding process for the CBs of the TRB 1 and the characteristic of the decoding process for the CBs of the TRB 2 can be placed into levels equivalent to each other.

Further, as described in the description of the second modification to the first embodiment described above, the processing order for the CBs of the TRB 1 and the CBs of the TRB 2 may be changed based on reliability information of the TRBs obtained by measurement of the SNR or the like. In particular, the decoding process can be carried out with priority beginning with a CB whose reliability is low from among the CBs of the TRB 1 and the CBs of the TRB 2.

Figure 18:
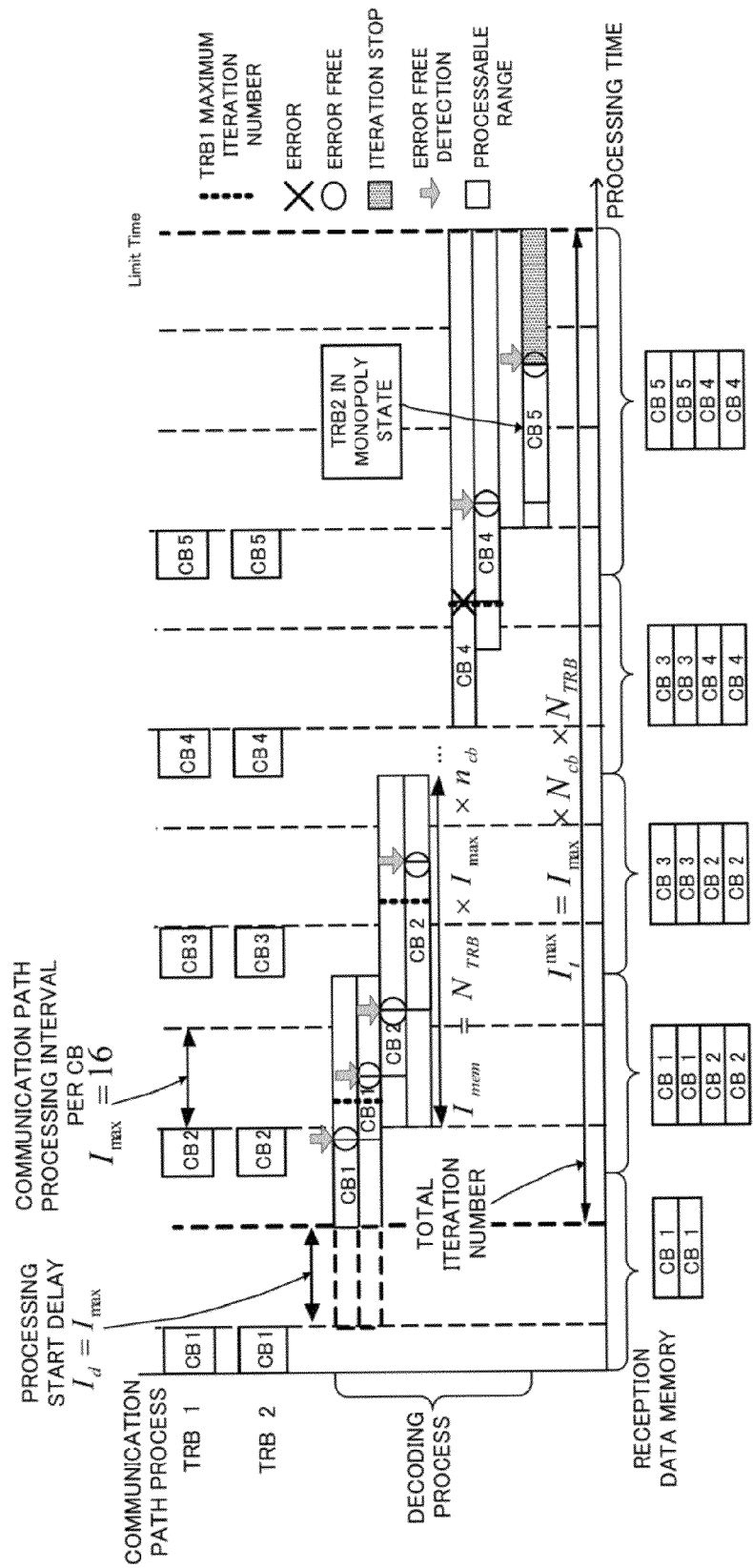
FIG. 18 is a view illustrating a processing method where a decoding error occurs during a decoding process according to the second embodiment.

FIG. 18 is a view illustrating a processing method where a decoding error occurs during the decoding process in the second embodiment.

As seen in FIG. 18, for example, if a decoding error occurs with the CB 4 of the TRB 1, then in the decoding process of the next CB 5, the overall resource can be allocated to the decoding process of the CB (CB 5) of the TRB 2 without carrying out the decoding process for the CBs of the TRB 1.

Figure 19:
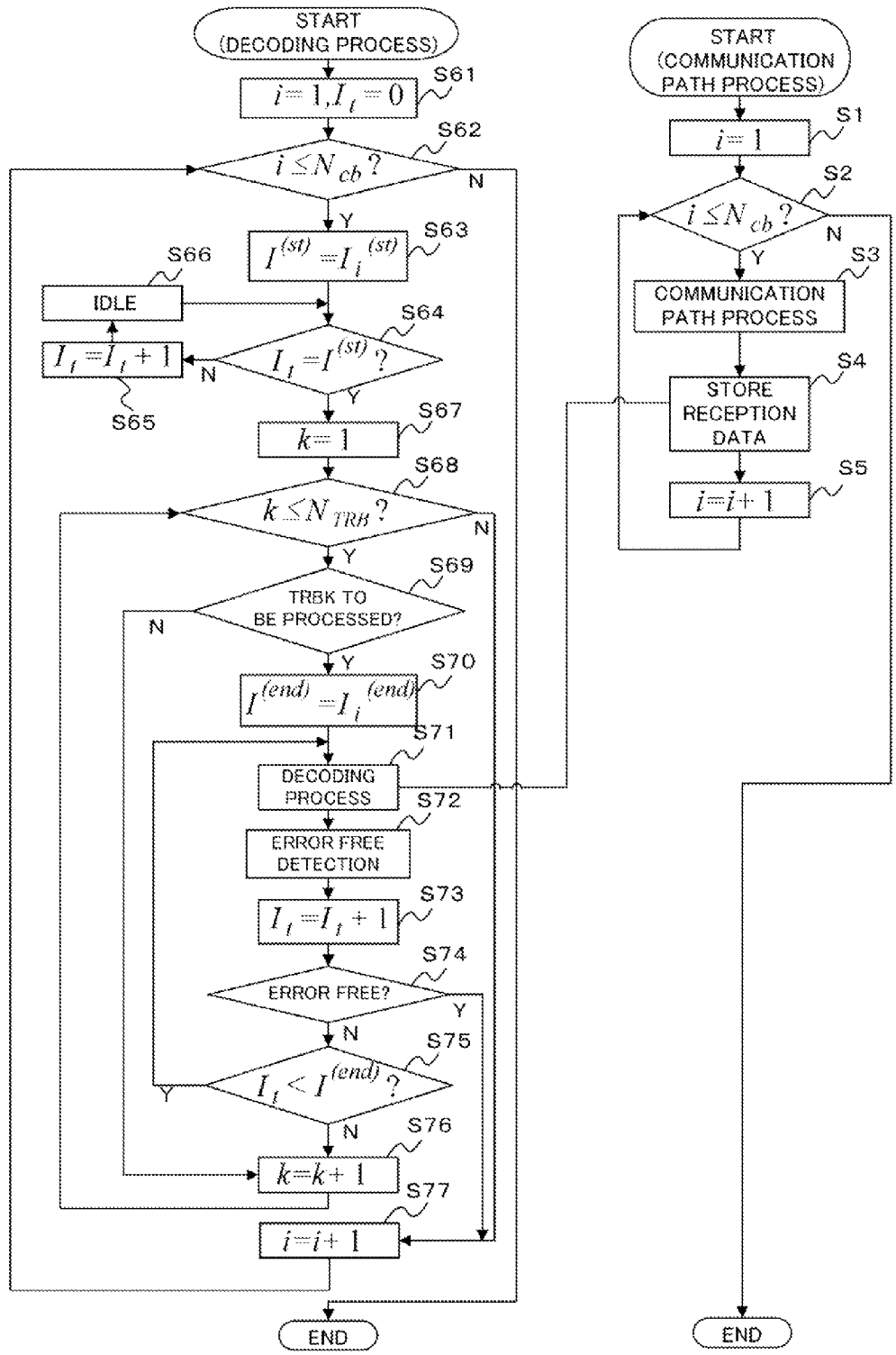
FIG. 19 is a view illustrating a processing flow of the receiver apparatus according to the second embodiment.

FIG. 19 is a view illustrating a processing flow of the receiver apparatus according to the second embodiment.

It is to be noted, since the communication path process (steps S1 to S5) is similar to that of the embodiment described above, description of the process is omitted.

In the decoding process, initialization of i (i is an integer equal to or greater than 1) that represents a target CB and $I_t$ ($I_t$ is an integer equal to or greater than 1) that represents the total iterative time number in which the CBs in the iterative decoder 242 are not distinguished from each other is carried out first (step S61). In particular, 1 is substituted into i and 0 is substituted into $I_t$.

Then, it is decided whether or not i is equal to or lower than $N_{cb}$ (step S62), and, if it is decided that is not equal to or lower than $N_{cb}$ (N route at step S62), then the decoding process is ended.

On the other hand, if it is decided that i is equal to or lower than $N_{cb}$ (Y route at step S62), then starting time of the processable time period of the decoding process for the ith CB is placed into $I^{(st)}$ (step S63), and it is decided whether or not the total iterative time number $I_t$ at present is equal to $I^{(st)}$ (step S64).

Here, if it is decided that the total iterative time number $I_t$ at present is not equal to $I^{(st)}$ (N route at step S64), then the processing waits until the total iterative time number $I_t$ at present becomes equal to $I^{(st)}$ (steps S65 and S66).

On the other hand, if it is decided that the total iterative time number $I_t$ at present is equal to $I^{(st)}$ (Y route at step S64), then 1 is substituted into the value of k (k is an integer equal to or greater than 1, and in the example illustrated in FIGS. 17 and 18, k=1 or 2) that represents a target TRB (step S67).

Then, it is decided whether or not the value of k is equal to or lower than $N_{TRB}$ (step S68), and, if it is decided that the value of k is not equal to or lower than $N_{TRB}$, then the processing target is changed to the next-CB (step S77), and the processing advances to step S62.

On the other hand, if it is decided that the value of k is equal to or lower than $N_{TRB}$, then it is decided whether or not the decoding process for the kth TRB is to be carried out (step S69). If it is decided that the decoding process for the kth TRB is not to be carried out (N route at step S69), then the value of k is incremented (step S76), and the processing advances to step S68.

On the other hand, if it is decided that the decoding process for the kth TRB is to be carried out (Y route at step S69), then ending time of the processable time period of the decoding process for the present CB is placed into $I^{(end)}$ (step S70), and the iterative decoding process is carried out for the ith CB stored in the communication path process (step S71).

Thereafter, error free detection is carried out for a result of the iterative decoding process just described (step S72), and the total iterative time number $I_t$ is incremented (step S73).

Then, if an error free condition is detected (Y route at step S74), then the processing advances to step S77.

On the other hand, if an error free condition is not detected (N route at step S74), then it is decided whether or not the total iterative time $I_t$ at present is smaller than $I^{(end)}$ (step S75). If it is decided that the total iterative time $I_t$ at present is smaller than $I^{(end)}$, then the processing advances to step S71, at which the iterative decoding process is carried out again for the present CB.

On the other hand, if it is decided that the total iterative time $I_t$ at present is not smaller than $I^{(end)}$ (N route at step S75), then the value of k is incremented (step S76), and the processing advances to step S68.

With the configuration described above, the decoding process for a plurality of TRBs can be carried out using the single iterative decoder, and reduction of the circuit scale and power consumption can be achieved and reduction of the reception data memory can be achieved.

[6] Others

The configurations, measures and functions of the receiver apparatus 20, 20A and 20B according to the embodiments and modifications described above may be selected and chosen when necessary or may be combined suitably. In particular, the configurations and functions described above may be selected and chosen or may be combined suitably and used so that the function of the present invention described above can be demonstrated.

Further, the error correction decoder 24 described above can be configured from an ASIC (Application Specific Integrated Circuit), an FPGA (Field Programmable Gate Array) or the like. Further, the error correction decoder 24 may be configured by suitably combining a DSP (Digital Signal Processing), a CPU (Central Processing Unit) and so forth.

Further, while the values of $n_{cb}$ and $m_{cb}$ are determined arbitrarily in the examples described above, an optimum value can be selected taking the performance of the receiver apparatus into consideration. For example, by setting the values of $n_{cb}$ and $m_{cb}$ low, the necessary memory size can be decreased still more. Or, by setting the values of $n_{cb}$ and $m_{cb}$ high, the memory staying time period for each CB becomes long and the degree of freedom and the reliability of the decoding process can be enhanced.

While the example in which the single iterative decoder 242 is used is described in the embodiments and modifications described above, for example, the decoding process of CBs described above can also be segmented by using a plurality of iterative decoders.

For example, in the embodiments and modifications described above, the decoding process for odd-numbered CBs can be carried out by a first iterative decoder and the decoding process for even-numbered CBs can be carried out by a second iterative decoder.

Further, the CBs can be distributed in accordance with the progress of the decoding process by the iterative decoders.

It is to be noted that, also in this instance, the memory staying time period of each CB is determined based on the communication path process for each CB.

Figure 20:
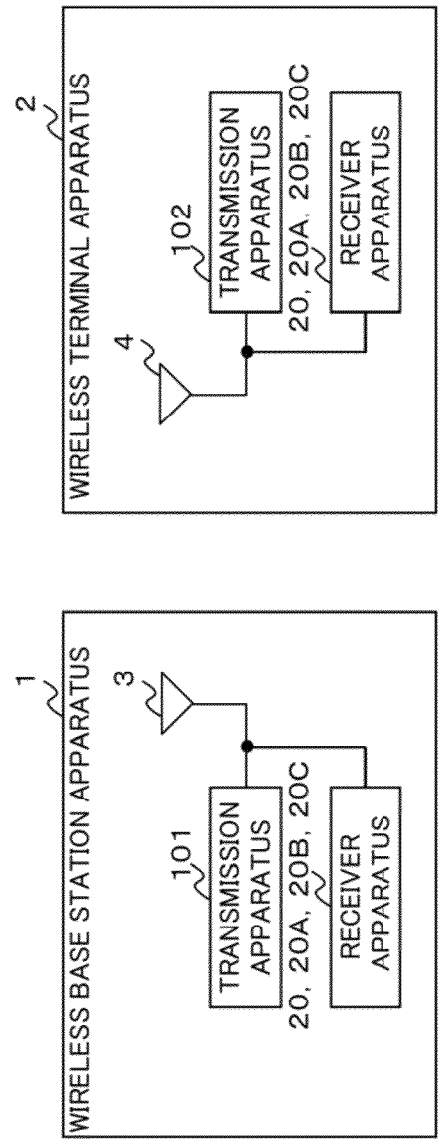
FIG. 20 is a block diagram illustrating an example of a configuration of a wireless communication system to which the receiver apparatus of the present invention is applied.

Further, the receiver apparatus 20, 20A and 20B according to the embodiments and modifications described above can be applied as a receiver apparatus in the wireless base station apparatus 1 or the wireless terminal apparatus 2 in the wireless communication system illustrated in FIG. 20. Further, the function of the receiver apparatus in the wireless base station apparatus 1 or the wireless terminal apparatus 2 can be implemented, for example, by the processor and a memory to which an SDR (Software Defined Radio) technique is applied and which are provided in the wireless base station apparatus 1 or the wireless terminal apparatus 2, by executing a program stored in the memory with the processor.

While the configuration is illustrated in FIG. 20 in which the present invention is applied to both of the receiver apparatus in the wireless base station apparatus 1 and the wireless terminal apparatus 2, naturally the present invention can be applied to only one of the receiver apparatus of the wireless base station apparatus 1 and the receiver apparatus of the wireless terminal apparatus 2.

It is to be noted that, in FIG. 20, the transmission antenna of the transmission apparatus 100 and the receiver antenna 14 of the receiver apparatus 20 are commonly used by the transmission and receiver antennas 3 and 4.

In relation to the embodiments and the modifications described above, the following iterative decoding method and apparatus are disclosed:

A iterative decoding method for an encoded signal for iteratively carrying out a decoding process for an encoded signal segmented and transmitted in a plurality of ($N_{cb}$) code blocks through a downlink data channel for each transport block unit, the iterative decoding method comprising:

storing a number of ($n_{cb}$) code blocks smaller than the number ($N_{cb}$) of the code blocks; and successively and iteratively carrying out a decoding process for each of the stored ($n_{cb}$) code blocks within a specified time period determined based on the number ($n_{cb}$).

A iterative decoding apparatus for an encoded signal for iteratively carrying out a decoding process for an encoded signal segmented and transmitted in a plurality of ($N_{cb}$) code blocks through a downlink data channel for each transport block unit, the iterative decoding apparatus comprising:

a memory that stores a number of ($n_{cb}$) code blocks smaller than the number ($N_{cb}$) of the code blocks; and a iterative decoder that successively and iteratively carries out a decoding process for each of the stored ($n_{cb}$) code blocks within a specified time period determined based on the number ($n_{cb}$).

Reduction of a memory amount required for a iterative decoding apparatus can be achieved by the disclosed technique.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) has (have) been described in detail, it should be understood that the various changes, substitutions, and alterations could be made hereto without departing from the spirit and scope of the invention.

What is claimed is:

1. A iterative decoding method for an encoded signal for iteratively carrying out a decoding process for the encoded signal segmented and transmitted in a plurality of ($N_{cb}$) sub blocks for each predetermined block unit, the iterative decoding method comprising:

storing a number of ($n_{cb}$) sub blocks smaller than the number ($N_{cb}$) of the sub blocks; and successively and iteratively carrying out a decoding process for each of the stored ($n_{cb}$) sub blocks within a specified time period determined based on the number ($n_{cb}$).

2. The iterative decoding method for the encoded signal according to claim 1, wherein the specified time period for each of the sub blocks is set so as to obtain a characteristic of a level equivalent to that of an error rate characteristic where the specified time period is not set.

3. The iterative decoding method for the encoded signal according to claim 1, wherein a starting timing of the iterative decoding process for each sub block is associated with a point of time of an end of a communication path process for the corresponding sub block.

4. The iterative decoding method for the encoded signal according to claim 3, wherein a plurality of communication path processes for the sub blocks are carried out in parallel to each other; and a starting timing of the specified time period for each of the plural sub blocks for which the communication path process is carried out in parallel is associated with the point of time of an end of the communication path process for the corresponding sub block.

5. The iterative decoding method for the encoded signal according to claim 4, wherein the specified time periods for the plural sub blocks for which the communication path process is carried out in parallel are set equal to each other; and
an order of the iterative decoding processes for the plural sub blocks for which the communication path process is carried out in parallel is determined based on reception data reliability.

6. The iterative decoding method for the encoded signal according to claim 5, wherein the iterative decoding processes for the plural sub blocks are set such that the iterative decoding process having low reception data reliability is carried out with priority.

7. The iterative decoding method for the encoded signal according to claim 1, wherein an error decision for each sub block is carried out during the iterative decoding process for the sub block.

8. The iterative decoding method for the encoded signal according to claim 7, wherein, where it is decided that there is an error in a certain one of the plural ($n_{cb}$) sub blocks, the iterative decoding process is inhibited for succeeding sub blocks to the sub block with regard to which the error is decided.

9. A iterative decoding method for an encoded signal for iteratively carrying out a decoding process for a first encoded signal segmented and transmitted in a plurality of ($N_{cb}$) sub blocks for each first block unit and a second encoded signal segmented and transmitted in another plurality of ($M_{cb}$) sub blocks for each second block unit, the iterative decoding method comprising:
carrying out a communication path process for the sub blocks of the first encoded signal and the second encoded signal in parallel to each other;
storing a number of ($n_{cb}$) sub blocks smaller than the number of ($N_{cb}$) sub blocks and a number of ($m_{cb}$) sub blocks smaller than the number of ($M_{cb}$) sub blocks;
setting each of a starting timing of a specified time period determined based on the number ($n_{cb}$) and a starting timing of another specified time period determined based on the number ($m_{cb}$), for the sub blocks of the first encoded signal and the second encoded signal for which the communication path processes are carried out in parallel to each other, in association with a point of time of an end of the communication path process for the corresponding sub block; and
successively and iteratively carrying out the decoding processes for the sub blocks within the specified time periods.

10. The iterative decoding method for the encoded signal according to claim 9, wherein the specified time period for each sub block is set so as to obtain a characteristic of a level equivalent to that of an error rate characteristic where the specified time period is not set.

11. The iterative decoding method for the encoded signal according to claim 9, wherein the specified time periods for the plural sub blocks for which the communication path process is carried out in parallel are set equal to each other; and
an order of the iterative decoding processes for the plural sub blocks for which the communication path process is carried out in parallel is determined based on reception data reliability.

12. The iterative decoding method for the encoded signal according to claim 11, wherein the iterative decoding processes for the plural sub blocks are set such that the iterative decoding process having low reception data reliability is carried out with priority.

13. The iterative decoding method for the encoded signal according to claim 9, wherein an error decision for each sub block is carried out during the iterative decoding process for the sub block.

14. The iterative decoding method for the encoded signal according to claim 13, wherein, where it is decided that there is an error in a certain one of the plural ($n_{cb}$, $m_{cb}$) sub blocks, the iterative decoding process is inhibited for succeeding sub blocks to the sub block with regard to which the error is decided.

15. A iterative decoding apparatus for an encoded signal that iteratively carries out a decoding process for the encoded signal segmented and transmitted in a plurality of ($N_{cb}$) sub blocks for each predetermined block unit, the iterative decoding apparatus comprising:
a memory that stores a number of ($n_{cb}$) sub blocks smaller than the number ($N_{cb}$) of the sub blocks; and
a iterative decoder that successively and iteratively carries out a decoding process for each of the stored ($n_{cb}$) sub blocks within a specified time period determined based on the number ($n_{cb}$).

16. The iterative decoding apparatus for the encoded signal according to claim 15, wherein the specified time period for each sub block is set so as to obtain a characteristic of a level equivalent to that of an error rate characteristic where the specified time is not set.

17. The iterative decoding apparatus for the encoded signal according to claim 15, wherein a starting timing of the iterative decoding process for each sub block is associated with a point of time of an end of a communication path process for the corresponding sub block.

18. The iterative decoding apparatus for the encoded signal according to claim 17, further comprising a communication path processor that carries out a plurality of communication path processes for the sub blocks in parallel to each other; and wherein
a starting timing of the specified time period for each of a plurality of sub blocks for which the communication path process is carried out in parallel is associated with the point of time of an end of the communication path process for the corresponding sub block.

19. The iterative decoding apparatus for the encoded signal according to claim 18, wherein the specified time periods for the plural sub blocks for which the communication path processes are carried out in parallel are set equal to each other; and
an order of the iterative decoding processes for the plural sub blocks for which the communication path processes are carried out in parallel is determined based on reception data reliability.

20. The iterative decoding apparatus for the encoded signal according to claim 19, wherein the iterative decoder carries out the iterative decoding processes for the plural sub blocks such that the iterative decoding process having low reception data reliability is carried out with priority.

* * * * *